United States Patent
Juengling

(10) Patent No.: US 10,319,725 B2
(45) Date of Patent: Jun. 11, 2019

(54) MEMORY ARRAYS

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 251 days.

(21) Appl. No.: 15/391,719

(22) Filed: Dec. 27, 2016

(65) Prior Publication Data

US 2018/0182763 A1     Jun. 28, 2018

(51) Int. Cl.
| | |
|---|---|
| *G11C 5/02* | (2006.01) |
| *H01L 29/78* | (2006.01) |
| *H01L 49/02* | (2006.01) |
| *H01L 27/088* | (2006.01) |
| *H01L 27/108* | (2006.01) |

(52) U.S. Cl.
CPC .... *H01L 27/10826* (2013.01); *H01L 27/0886* (2013.01); *H01L 27/10876* (2013.01); *H01L 27/10879* (2013.01); *H01L 27/10891* (2013.01); *H01L 28/40* (2013.01); *H01L 29/785* (2013.01); *G11C 5/025* (2013.01)

(58) Field of Classification Search
CPC ......... H01L 27/10879; H01L 27/10891; G11C 5/025
See application file for complete search history.

(56) References Cited

U.S. PATENT DOCUMENTS

| | | |
|---|---|---|
| 8,741,758 B2 | 6/2014 | Juengling |
| 2009/0237996 A1 | 9/2009 | Kirsch et al. |
| 2011/0193157 A1 | 8/2011 | Juengling |
| 2014/0110786 A1* | 4/2014 | Kim ................. H01L 27/10876 257/365 |
| 2014/0185355 A1 | 7/2014 | Juengling |

\* cited by examiner

*Primary Examiner* — Farun Lu
(74) *Attorney, Agent, or Firm* — Wells St. John P.S.

(57) ABSTRACT

Some embodiments include a memory array having memory cells arranged in rows and columns. The rows extend along a first direction and the columns extend along a second direction, with an angle between the first and second directions being less than 90°. Wordline trunk regions extend across the array and along a third direction substantially orthogonal to the second direction of the columns. Wordline branch regions extend from the wordline trunk regions and along the first direction. Semiconductor-material fins are along the rows. Each semiconductor-material fin has a first source/drain region, a second source/drain region, and a channel region between the first and second source/drain regions. Each channel region is overlapped by a wordline branch. Digit lines extend along the columns and are electrically coupled with the second source/drain regions. Charge-storage devices are electrically coupled with the first source/drain regions.

24 Claims, 24 Drawing Sheets

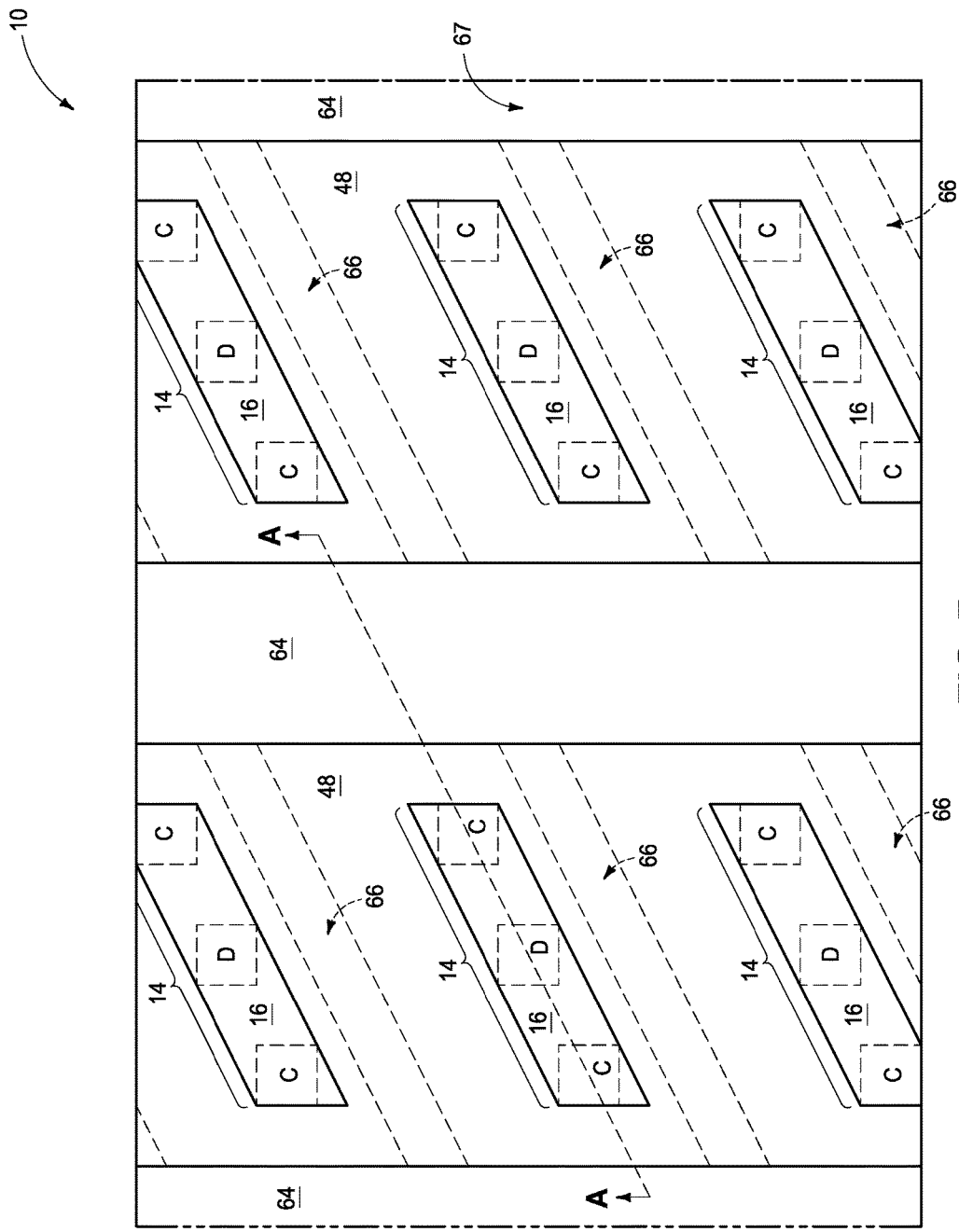
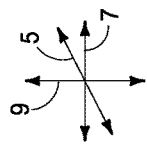
FIG. 7

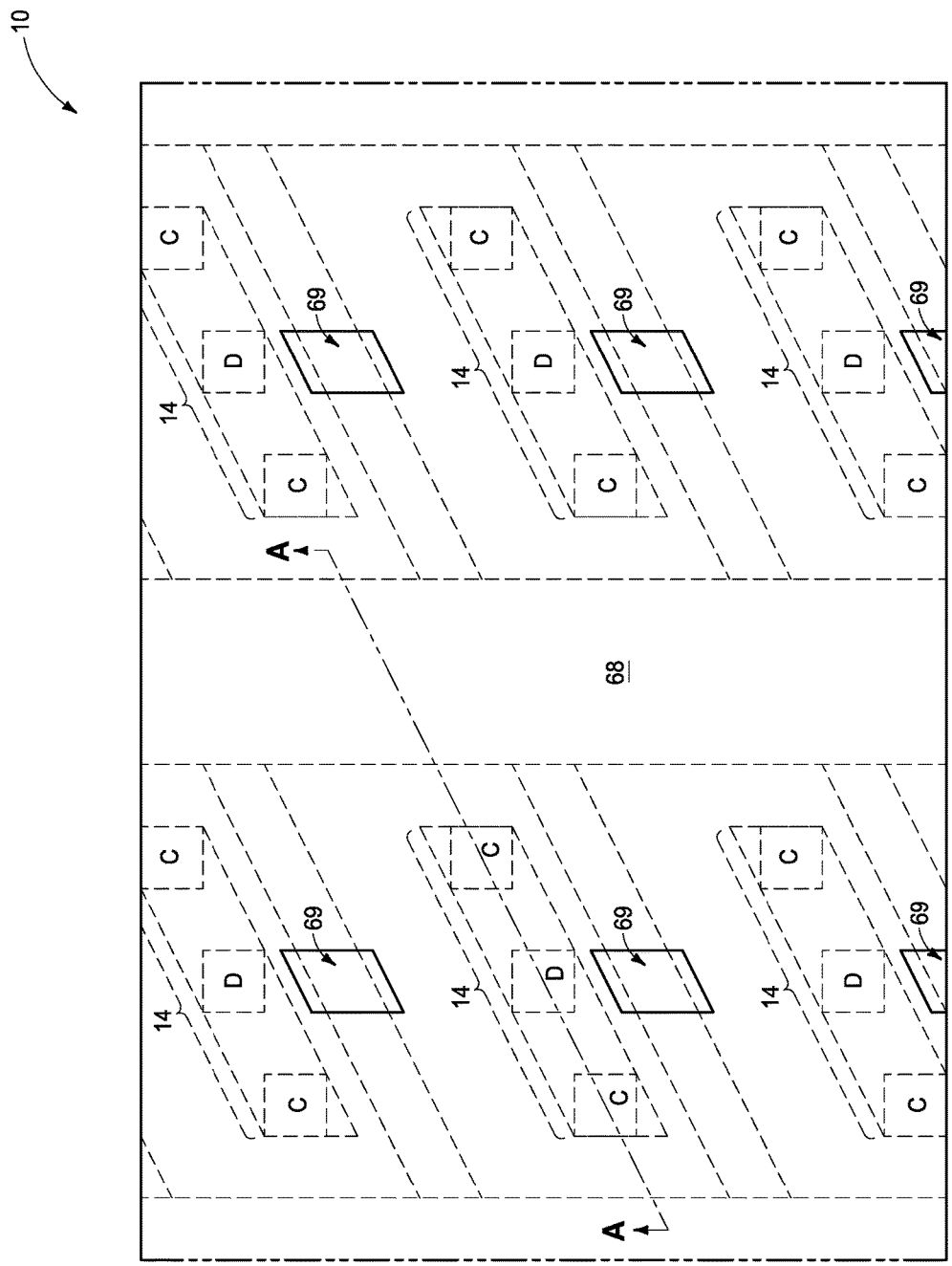
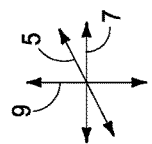
FIG. 9

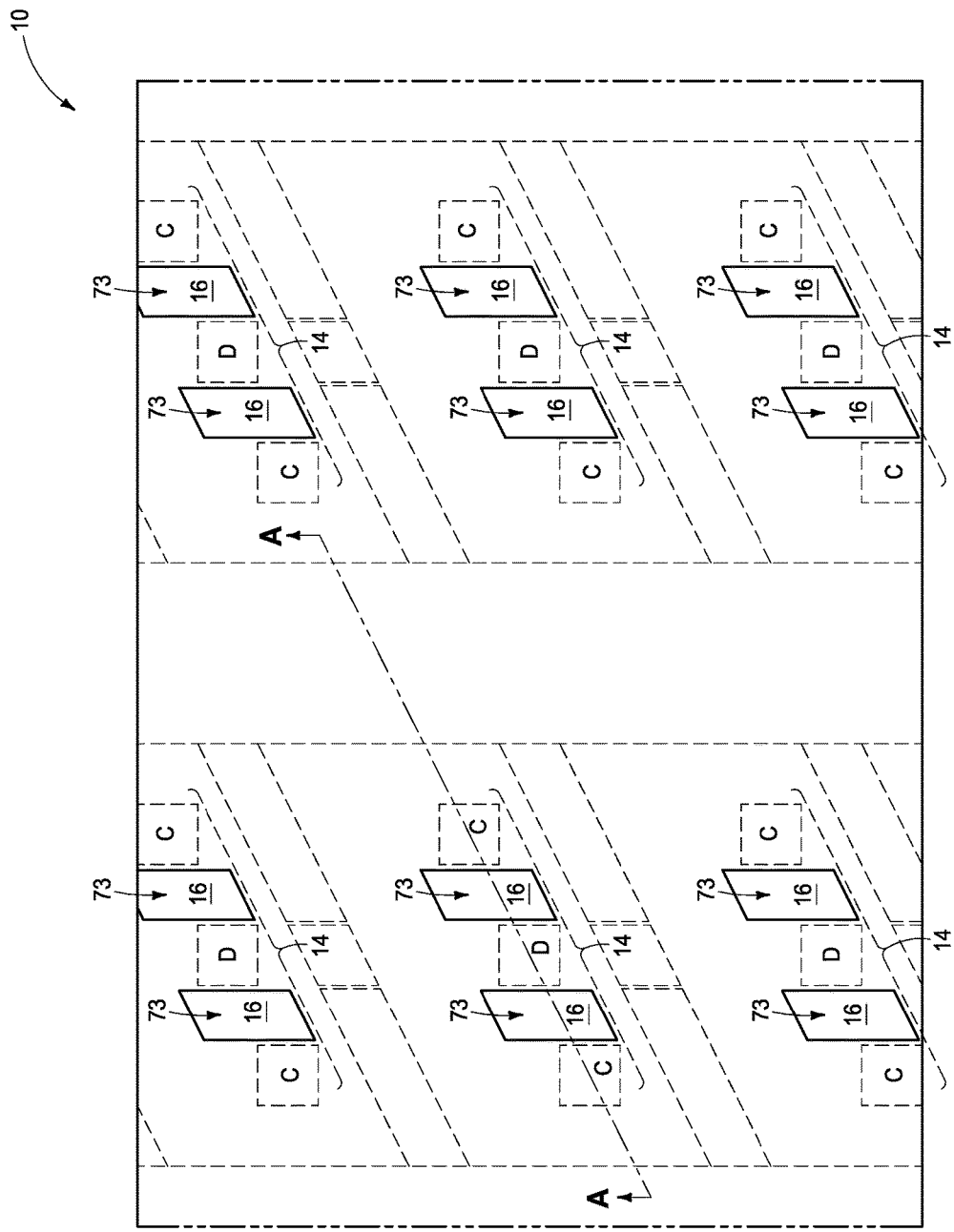
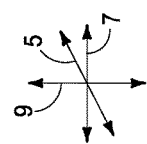
FIG. 13

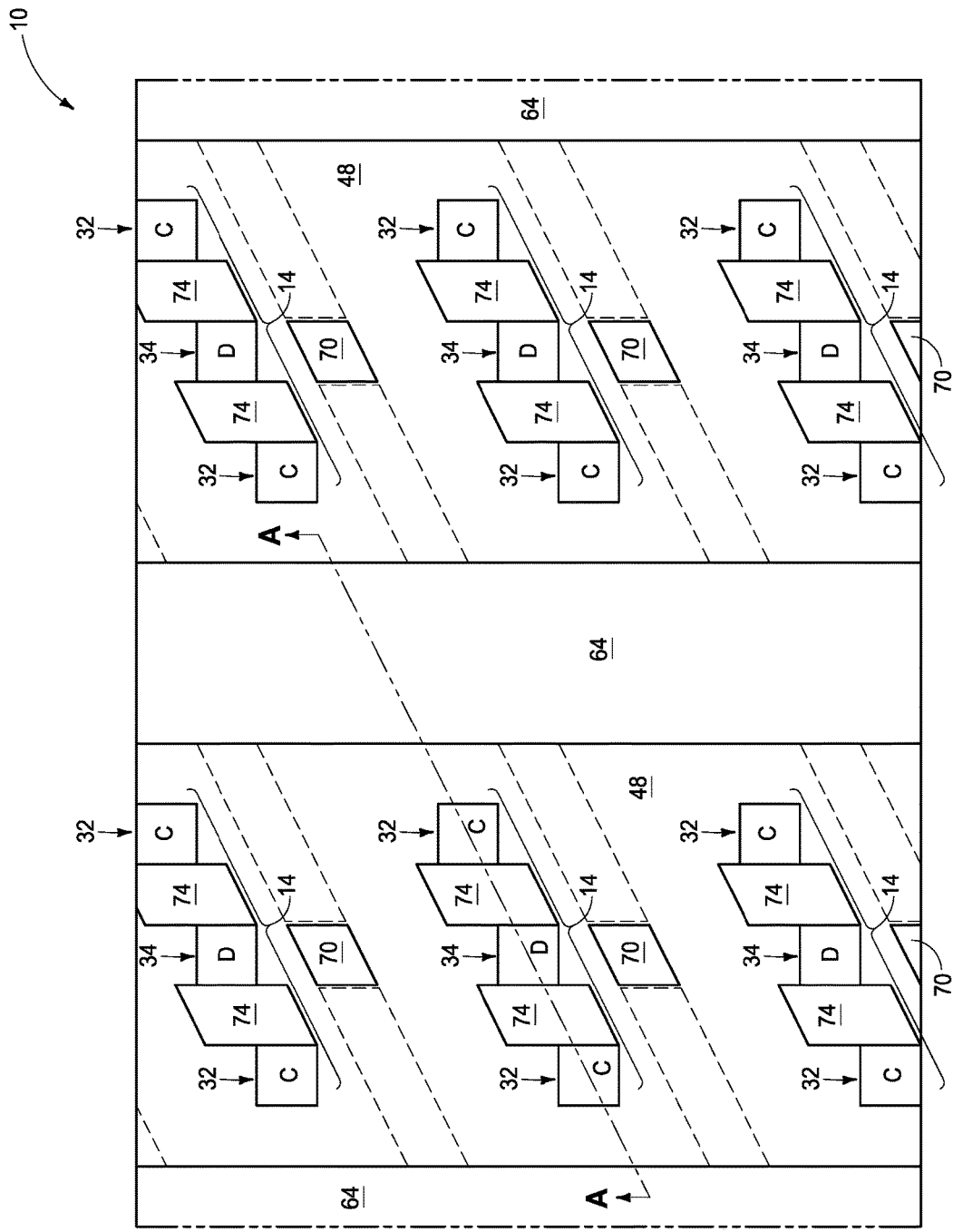
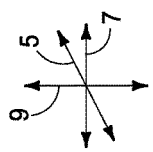
FIG. 15

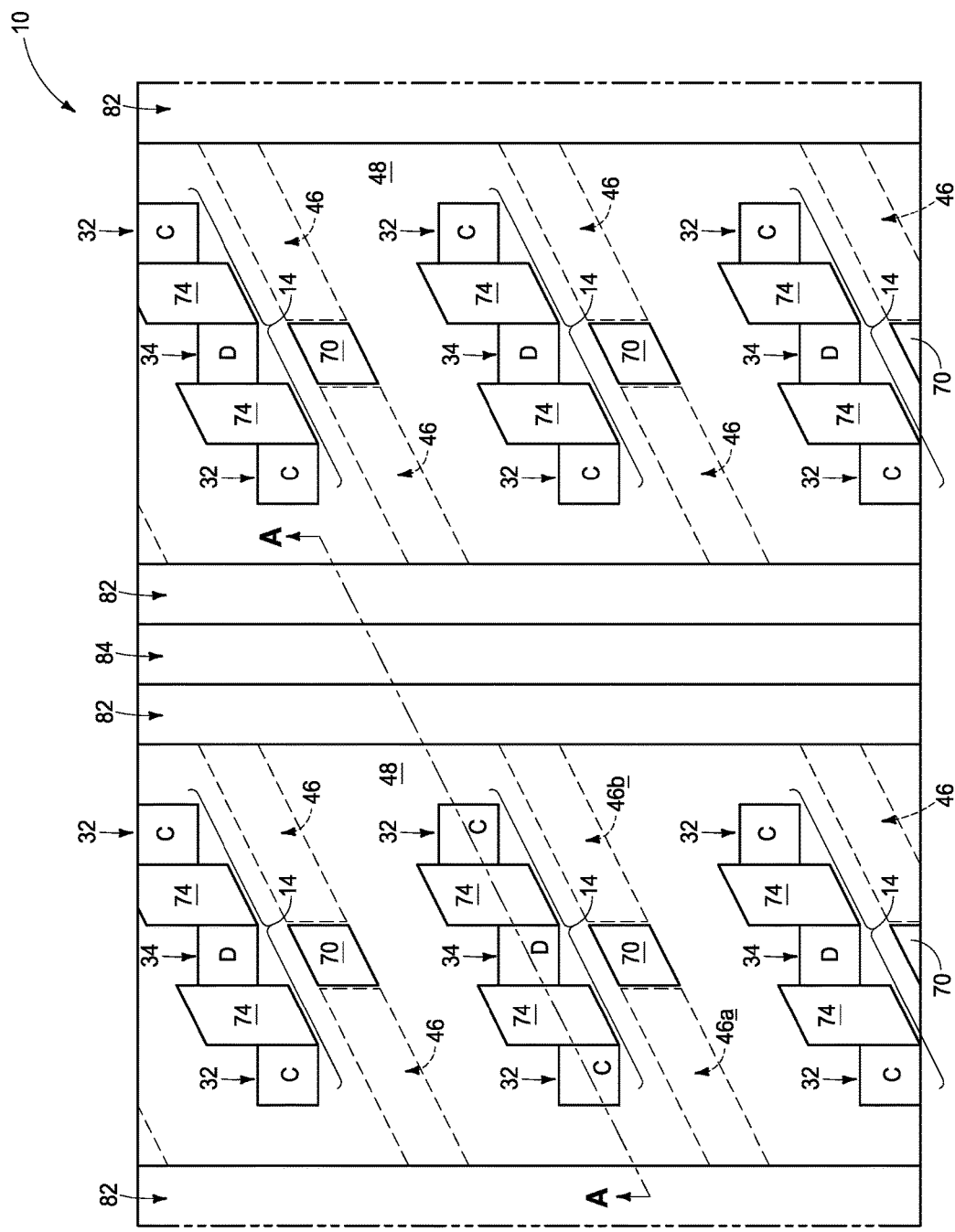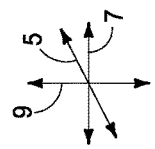
FIG. 19

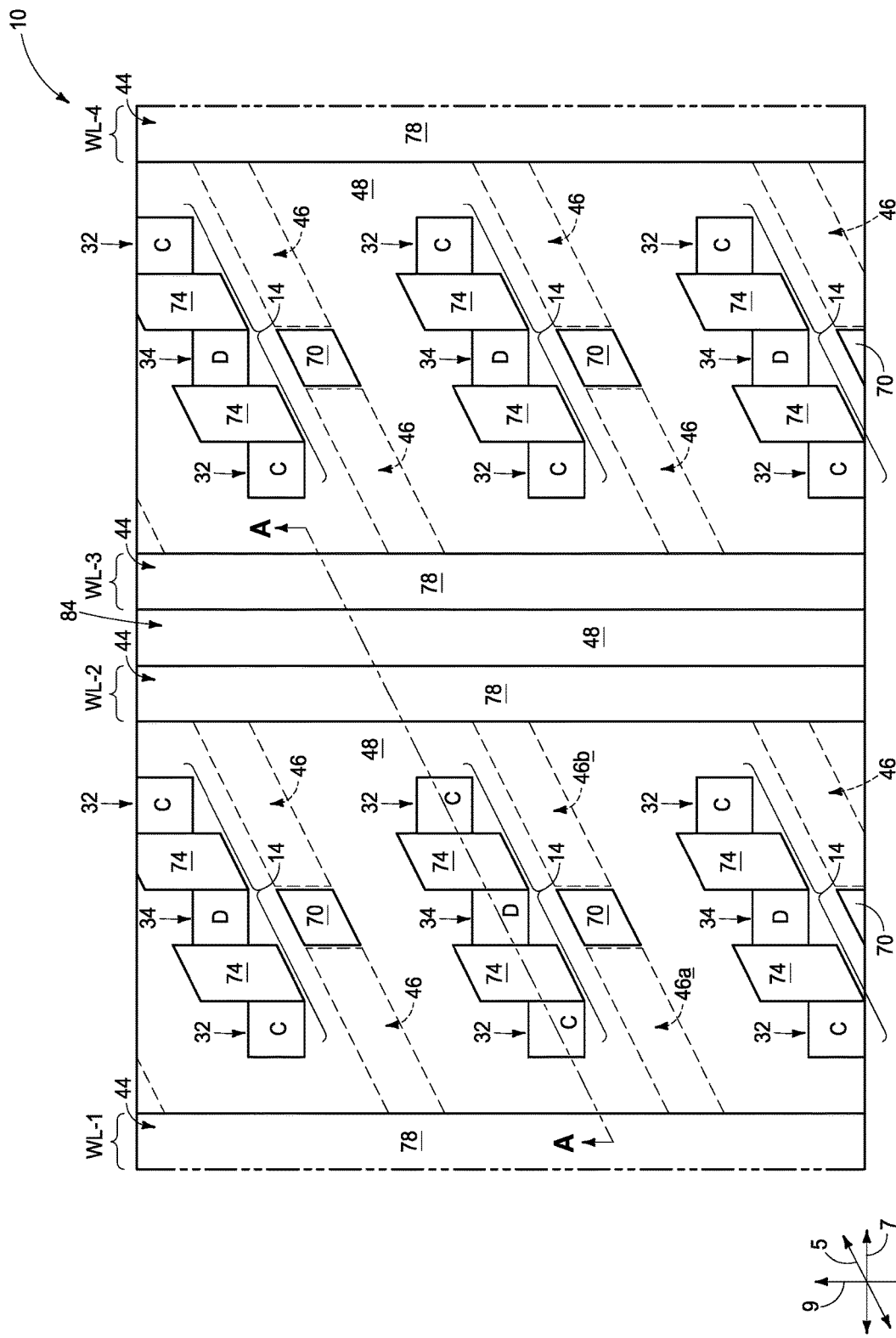
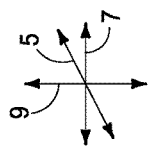
FIG. 21

US 10,319,725 B2

MEMORY ARRAYS

TECHNICAL FIELD

Memory arrays comprising finFET transistors.

BACKGROUND

Fin field effect transistors (finFETs) may be incorporated into integrated circuitry. Each finFET includes a fin (a tall thin semiconductor member) extending generally perpendicularly from a substrate. The fin comprises a pair of opposing sidewalls, and gate material is provided along at least one of the sidewalls. The gate material is spaced from the sidewall by gate dielectric material. A pair of source/drain regions is provided within the fin, and a channel region extends between the source/drain regions. In operation, the gate is utilized to selectively control current flow within the channel region.

The finFETs may be utilized as access transistors in integrated memory arrays; such as, for example, dynamic random access memory (DRAM) arrays. In some applications the finFETs may be incorporated into crosshair memory cells. In such applications the source/drain regions are on a pair of upwardly-projecting pedestals, and the channel region is along a trough extending between the pedestals. A charge-storage device (for instance, a capacitor) is electrically coupled with one of the source/drain regions, and a digit line is electrically coupled with the other of the source/drain regions. The gate is beneath the source/drain regions, and extends along the trough comprising the channel region. Example finFET structures, and example crosshair memory cells, are described in U.S. Pat. No. 8,741,758, and U.S. patent publication numbers 2009/0237996 and 2011/0193157.

It is desired to develop improved finFET devices which are suitable for utilization in highly integrated applications, to develop improved architectures for incorporating finFET devices into highly integrated memory and/or other circuitries, and to develop improved methods for fabricating architectures comprising finFET devices.

BRIEF DESCRIPTION OF THE DRAWINGS

FIGS. 7-24 are diagrammatic top views and diagrammatic cross-sectional side views of a region of a construction at various process stages of an example method of forming an example memory array. FIGS. 7, 9, 11, 13, 15, 17, 19, 21 and 23 are top views at sequential process stages. FIGS. 8, 10, 12, 14, 16, 18, 20, 22 and 24 are views along the lines A-A of the top views at the sequential process stages.

DETAILED DESCRIPTION OF THE ILLUSTRATED EMBODIMENTS

Some embodiments include memory device architectures having crosshair memory cells arranged in rows which extend along a first direction, and having columns which extend along a second direction, with an angle between the first and second directions being less than 90°. Wordline trunk regions extend along a third direction which is substantially orthogonal to the second direction of the columns. Wordline branch regions extend from the trunk regions along the first direction of the rows, and overlap channel regions associated with the crosshair memory cells. Some embodiments include methods of forming memory arrays. These and other aspects are described with reference to FIGS. 1-24.

Figure 1:
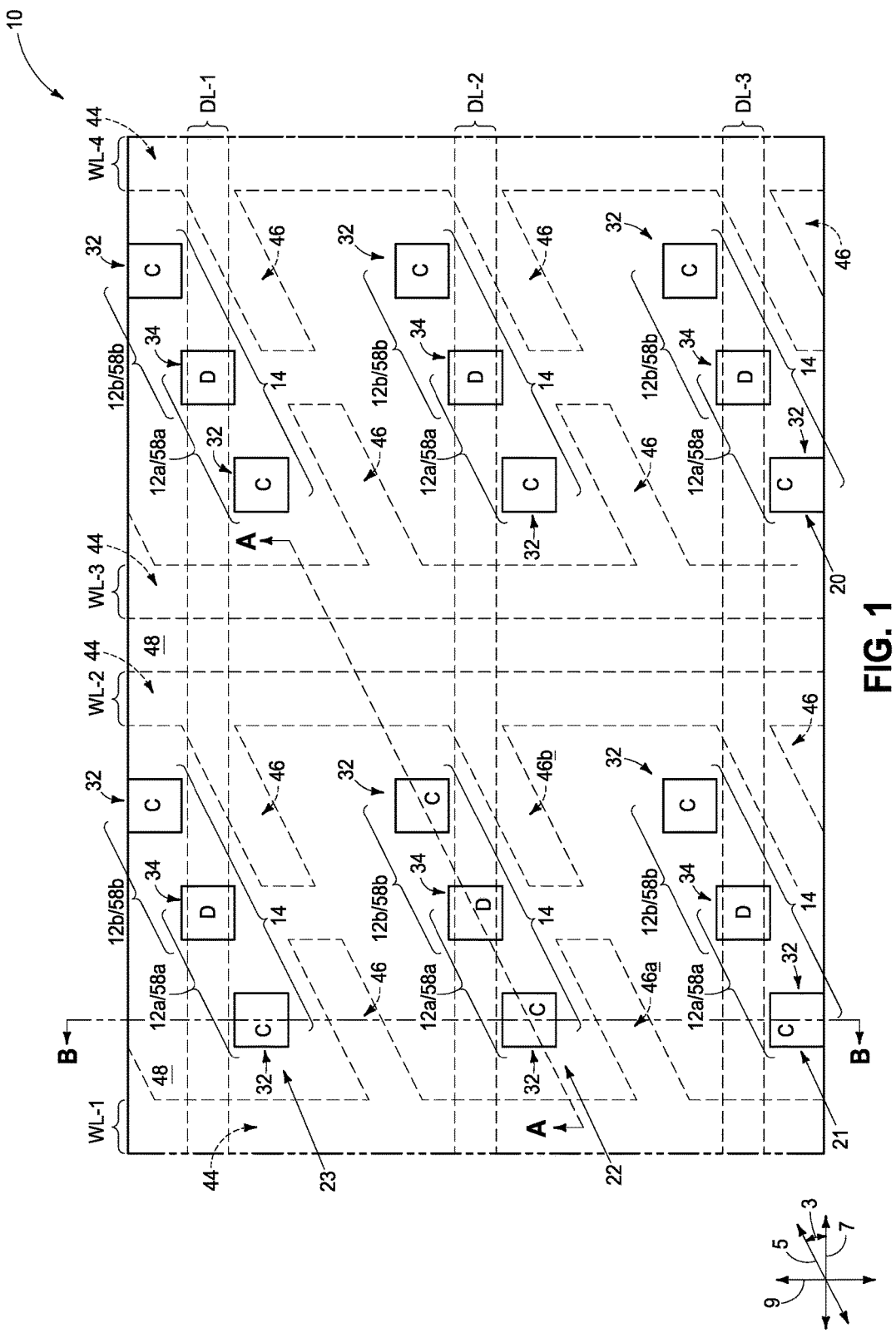
FIGS. 1-3 are a diagrammatic cross-sectional top-down view and diagrammatic cross-sectional side views of a region of an example memory array. The view of FIG. 2 is along the line A-A of FIG. 1; the view of FIG. 3 is along the line B-B of FIG. 1. The view of FIG. 1 is along the lines 1-1 of FIGS. 2 and 3.
Figure 2:
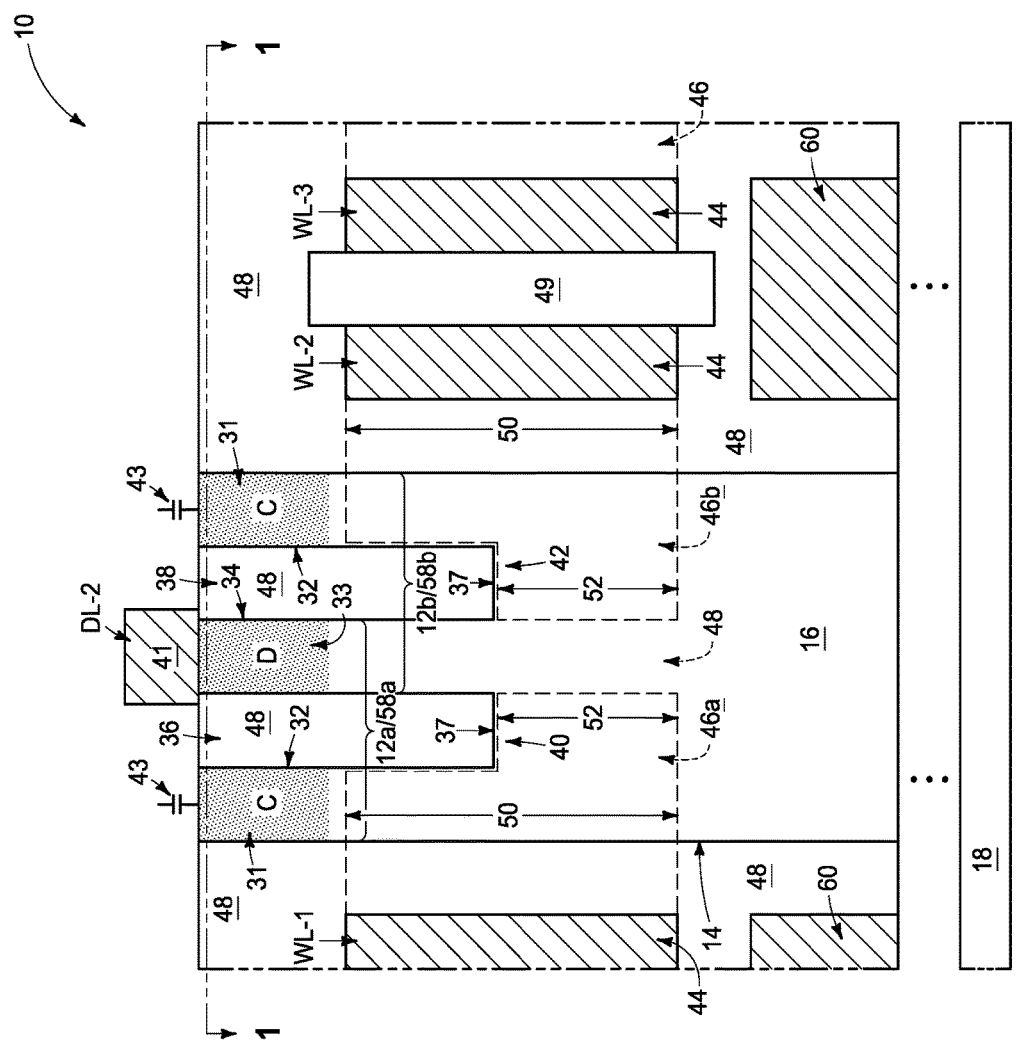
Figure 3:
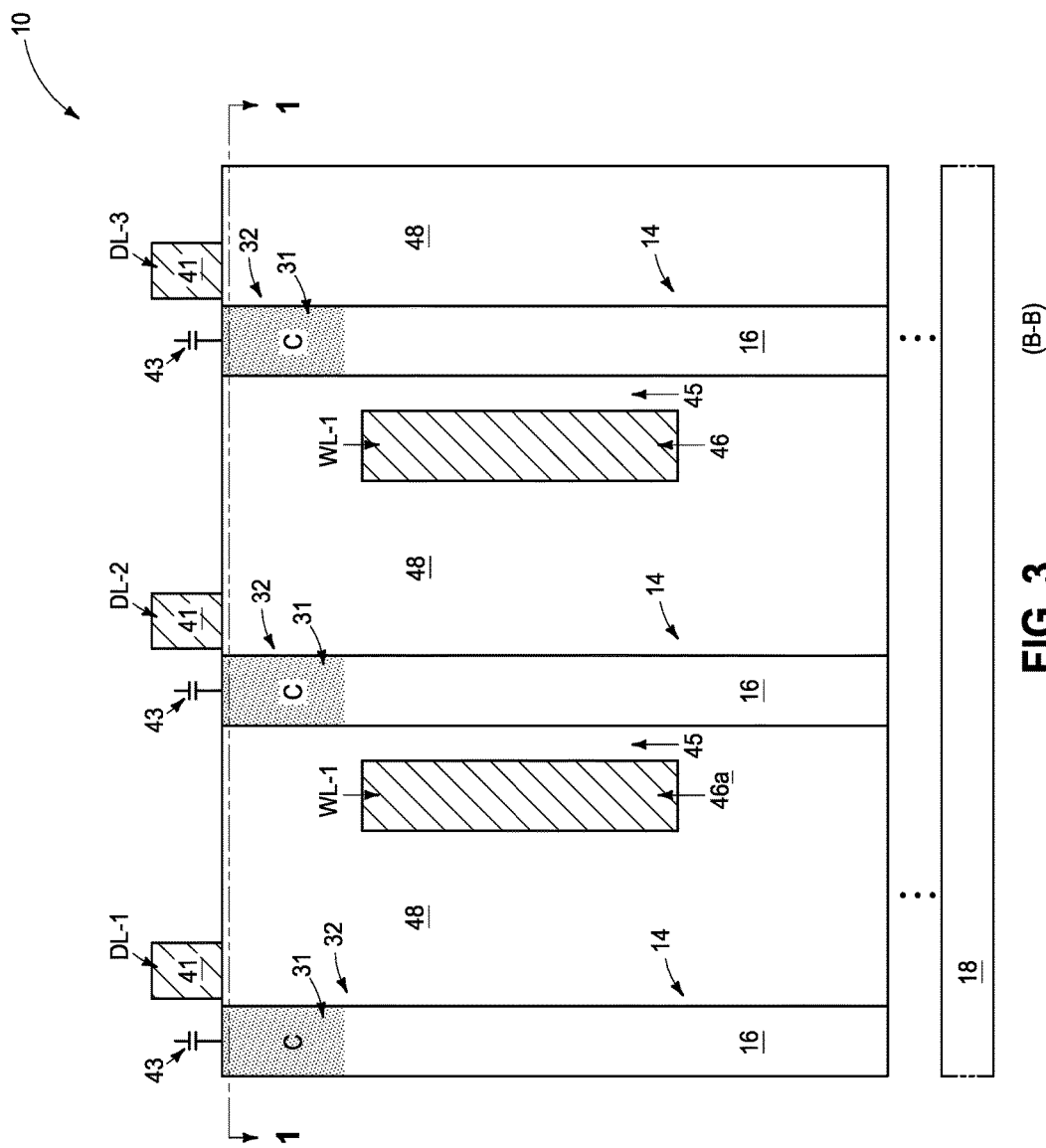
Figure 4:
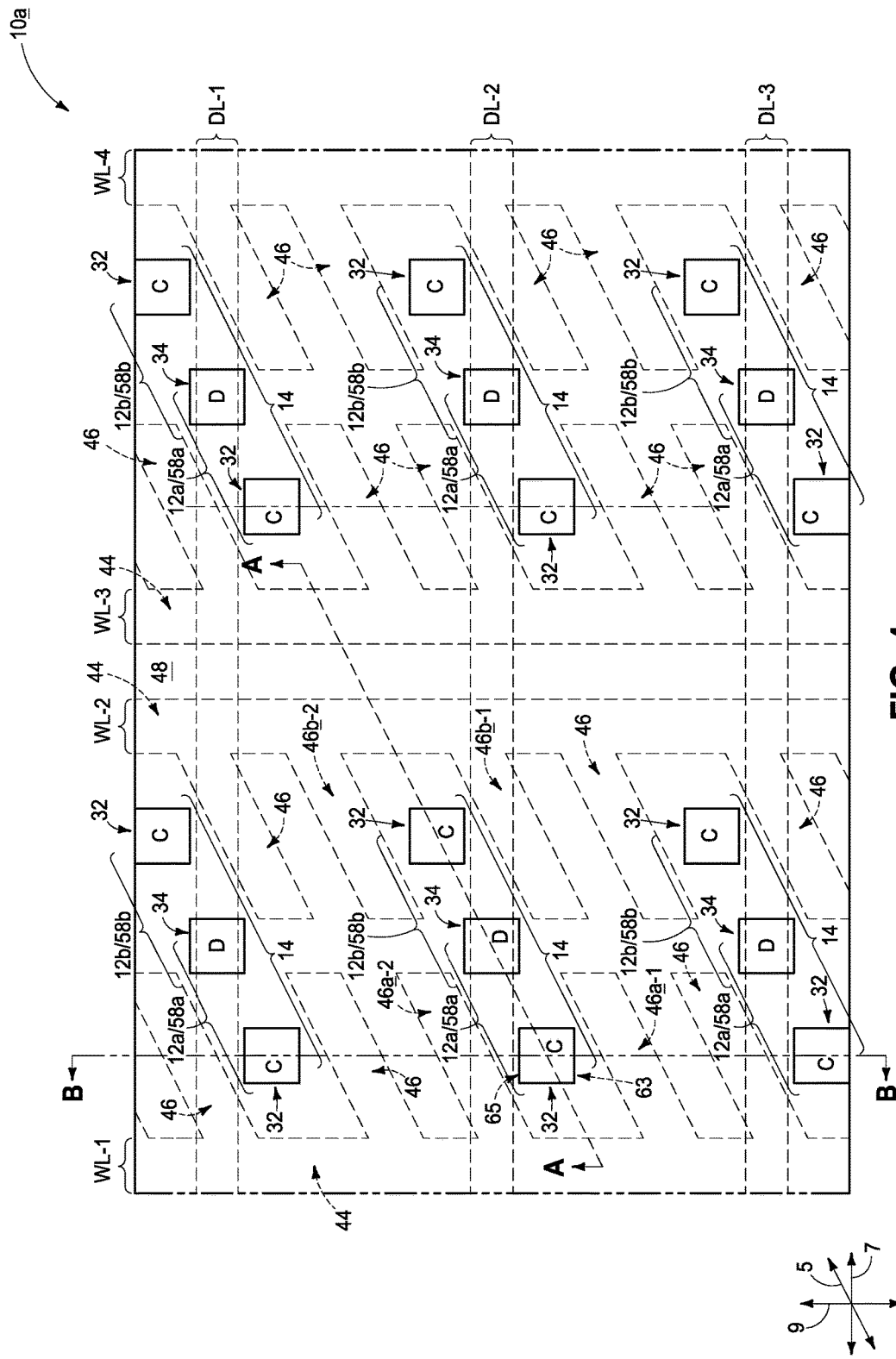
FIGS. 4-6 are a diagrammatic cross-sectional top-down view and diagrammatic cross-sectional side views of a region of an example memory array. The view of FIG. 5 is along the line A-A of FIG. 4; the view of FIG. 6 is along the line B-B of FIG. 4. The view of FIG. 4 is along the lines 4-4 of FIGS. 5 and 6.

A portion of an example memory array 10 is diagrammatically illustrated in FIGS. 1-3. The views of FIGS. 2 and 3 are side view cross-sections along the lines A-A and B-B, respectively, of FIG. 1; and the view of FIG. 1 is a top-down cross-section along the line 1-1 of FIGS. 2 and 3.

The memory array 10 includes a plurality of fins 14 of semiconductor material 16. The fins are arranged in rows 20-23; with such rows extending along a first direction of an axis 5 (the axis 5 is shown adjacent the top view of FIG. 1). The first direction of axis 5 corresponds to a row direction of memory array 10.

The semiconductor material 16 of fins 14 may comprise any suitable semiconductor material, and in some embodiments may comprise, consist essentially of, or consist of silicon.

The fins 14 extend upwardly from a substrate 18 (shown in FIGS. 2 and 3). The substrate 18 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the substrate 18 may correspond to a semiconductor substrate containing one or more materials associated with integrated circuit fabrication. Such materials may include, for example, one or more of refractory metal materials, barrier materials, diffusion materials, insulator materials, etc. The substrate 18 is illustrated to be spaced from fins 14 to indicate that there may be circuitry, materials, levels, etc. (not shown) between the substrate 18 and the fins 14 in some embodiments. In some embodiments the substrate 18 may be in direct contact with the fins 14.

Each fin 14 comprises a pair of outer pedestals 32 and an inner pedestal 34 between the outer pedestals. The outer pedestals 32 may be referred to as first pedestals, and the inner pedestals 34 may be referred to as second pedestals. The pedestals 32/34 may have any suitable dimensions in the top-down view of FIG. 1 (where the pedestals 32/34 are labeled as "C" or "D"), including, for example, F/2, F/4, etc., where F is a minimum feature size of a lithographic process utilized during fabrication of the pedestals 32/34.

Each of the fins 14 comprises a first trough 36 between one of the first pedestals 32 and the inner pedestal 34, and a second trough 38 between the other of the first pedestals 32 and the inner pedestal 34. The troughs 36/38 have bottom edges 37.

The first pedestals 32 contain first source/drain regions 31, and the second pedestals 34 contain second source/drain regions 33. The first and second source/drain regions 31/33 are diagrammatically illustrated with stippling. The source/drain regions 31/33 may be formed to any suitable depth, and may comprise any suitable dopant. For instance, the source/drain regions 31/33 may be heavily doped with n-type dopant (or, in some embodiments with p-type dopant). The heavy doping may correspond to, for example, a dopant concentration in excess of $10^{20}$ atoms/cm$^3$. Lower regions of fins 14 (i.e., regions of the fins 14 beneath the source/drain regions 31/33) may be intrinsically doped. The intrinsic dopant level may correspond to a dopant level of less than or equal to about $10^{15}$ atoms/cm$^3$. In some embodiments the lower regions of the fins 14 may have p− (i.e., p minus) dopant levels, with such dopant levels corresponding to less than or equal to about $10^{16}$ atoms/cm$^3$.

Channel regions 40/42 extend along the troughs 36/38. The channel regions 40 may be referred to as first channel regions, and the channel regions 42 may be referred to as second channel regions. The channel regions 40/42 extend between the first source/drain regions 31 and the second source/drain regions 33.

Each fin comprises two finFET transistors 12a and 12b, which may be referred to as first and second FinFET transistors, respectively. Each of the first finFET transistors 12a comprises a first source/drain region 31, a second source/drain region 33, and a first channel region 40 between the first and second transistors; and each of the second finFET transistors 12b comprises a first source/drain region 31, a second source/drain region 33, and a second channel region 42 between the first and second transistors.

The first source/drain regions 31 may be electrically coupled to charge-storage devices, and are each labeled with a C. The charge-storage devices may be capacitors or any other structures suitable for reversibly storing charge. Capacitors 43 are diagrammatically illustrated in the views of FIGS. 2 and 3 as examples of charge-storage devices. The capacitors may be ferroelectric capacitors (i.e., may comprise ferroelectric material between a pair of capacitor electrodes) or non-ferroelectric capacitors (i.e., may comprise non-ferroelectric material between a pair of capacitor electrodes).

The second source/drain regions 33 are electrically coupled with digit lines (e.g., DL-1, DL-2 and DL-3) and are each labeled with a D. The digit lines DL-1, DL-2 and DL-3 are shown in dashed-line (phantom) view in FIG. 1 to indicate that they are out of the plane of the FIG. 1 view (and specifically above the plane of the FIG. 1 view).

The digit lines DL-1, DL-2 and DL-3 comprise digit line material 41. The digit line material 41 may comprise any suitable electrically conductive composition or combination of compositions; such for example, one or more of various metals (e.g., titanium, tungsten, cobalt, nickel, platinum, etc.) and/or metal-containing compositions (e.g., metal silicide, metal nitride, metal carbide, etc.) over conductively-doped semiconductor material (e.g., conductively-doped silicon, conductively-doped germanium, etc.).

The digit lines DL-1, DL-2 and DL-3 extend along a second direction of an axis 7 (the axis 7 is shown adjacent the top view of FIG. 1). The digit line direction corresponds to a column direction of the memory array 10. An angle 3 between the row direction of axis 5 and the column direction of axis 7 is less than 90°.

The digit lines DL-1, DL-2 and DL-3 may be substantially straight lines (as shown) or may be wavy lines or any other suitable configuration.

Wordlines WL-1, WL-2, WL-3 and WL-4 extend across memory array 10. The wordlines WL-1, WL-2, WL-3 and WL-4 comprise wordline trunk regions 44 extending along a third direction of an axis 9 (the axis 9 is shown adjacent the top view of FIG. 1), and wordline branch regions 46 extending from the wordline trunk regions 44 and along the row direction of axis 5. The wordline trunk regions 44 and wordline branch regions 46 are shown in dashed-line (phantom) view in FIG. 1 to indicate that they are out of the plane of the FIG. 1 view (and specifically below the plane of the FIG. 1 view). The wordline trunk regions 44 are substantially orthogonal to the digit lines DL-1, DL-2 and DL-3 in the shown embodiment, with the term "substantially orthogonal" meaning orthogonal to within reasonable tolerances of fabrication and measurement.

The wordline branch regions 46 extend along sidewalls of the fins 14, and are spaced from such sidewalls by gate dielectric material 45. The wordline branch regions 46 and gate dielectric 45 are shown in FIG. 3. The wordline branch regions 46 are also diagrammatically illustrated in FIG. 2 with dashed-lines (i.e., phantom view) since the wordline branch regions 46 are out of the plane relative to the view of FIG. 2 (and specifically the wordline branch regions 46 are in front of the plane of the FIG. 2 view).

The wordline trunk regions 44 and wordline branch regions 46 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The wordline trunk regions 44 may comprise a same composition as the wordline branch regions 46 in some embodiments, and may comprise different compositions than the wordline branch regions 46 in other embodiments.

The wordline trunk regions 44 and wordline branch regions 46 may have any suitable width dimension when view from above (i.e., the view of FIG. 1); including, for example, F/2, F/4, F/6, etc., where F is a minimum feature size of a lithographic process utilized during fabrication of the wordline trunk regions 44 and wordline branch regions 46.

The gate dielectric material 45 may comprise any suitable electrically insulative material, such as, for example, silicon dioxide. In the shown embodiment, the gate dielectric material 45 is shown merging with other dielectric material 48. Such implies that the gate dielectric material 45 comprises a common composition as the other dielectric material 48. In other embodiments, the gate dielectric material 45 may comprise a different composition than at least some of the remaining dielectric material 48. Further, although the dielectric material 48 is illustrated to be a single homogeneous composition, in other embodiments the dielectric material 48 may comprise two or more different compositions.

The adjacent wordlines WL-2 and WL-3 are shown spaced from one another by insulative material 49 (FIG. 2) which is different from the dielectric material 48. The insulative material 49 may comprise any suitable composition or combination of compositions; such as, for example, silicon dioxide, silicon nitride, etc. The insulative material 49 may be the same composition as material 48 in some embodiments, and may be a different composition than material 48 in other embodiments.

The wordline branch regions 46 overlap the first and second channel regions 40/42 such that current flow along the channel regions 40/42 is selectively activated by selectively energizing appropriate wordlines WL-1, WL-2, WL-3 or WL-4.

In some embodiments, the wordline branch regions 46 associated with an individual fin 14 may be considered to be a first wordline branch region 46a overlapping the first channel region 40, and a second wordline branch region 46b overlapping the second channel region (the first and second wordline branch regions 46a/46b are labelled relative to the fin 14 of shown in the cross-section of FIG. 2). Accordingly, the wordline branch region 46a is part of the finFET 12a, and the wordline branch region 46b is part of the finFET 12b. The wordline branch regions 46a and 46b are comprised by different wordlines (with wordline branch region 46a of FIG. 2 being comprised by wordline WL-1 and wordline branch region 46b being comprised by wordline WL-2). Accordingly, finFETs 12a and 12b are accessed by different wordlines relative to one another and may thus share a digit line (e.g., digit line DL-2 of FIG. 2) and still be uniquely addressed for read/write operations.

The wordline branch regions 46a/46b form transistor gates of the finFET transistors 12a/12b and may or may not overlap one or both of the heavily-doped regions 31/33. In practice, there may be lightly-doped extension regions provided between the heavily-doped regions and the transistor gates. The lightly-doped extension regions may be implanted regions and/or may form operationally during operation of gated devices.

The wordline branch regions 46a and 46b are spaced from one another by dielectric material 48 which extends along the second pedestals 34 of fins 14 (as shown in FIG. 1, and diagrammatically illustrated in FIG. 2 with a dashed arrow showing a region of dielectric material 48 between the wordline branch regions 46a and 46b). In some embodiments the dielectric material 48 between wordline branch regions 46a and 46b may be referred to as insulative structure along the second pedestal 34 of a fin 14; with such insulative structure spacing the adjacent wordline branch regions 46a and 46b from one another, and electrically separating the adjacent wordline branch regions 46a and 46b from one another.

The combination of a first access transistor 12a with a charge-storage device (e.g., capacitor 43) forms a first memory cell 58a, with a charge state of the charge-storage device corresponding to a memory state of the memory cell. Similarly, the combination of a second access transistor 12b with a charge-storage device (e.g., capacitor 43) forms a second memory cell 58b. The memory cells 58a/58b are arranged in rows and columns across the memory array 10. The wordline branch regions 46 extend along rows of the memory cells 58a/58b within the memory array 10. The digit line lines DL-1, DL-2 and DL-3 extend along columns of the memory cells 58a/58b within the memory array 10. Each of the memory cells 58a/58b may be uniquely addressed with a digit line (e.g., DL-1, DL-2 and DL-3) and a wordline (e.g., WL-1, WL-2, WL-3 and WL-4).

The cross-section of FIG. 2 shows that the wordline branch regions 46a/46b are taller in regions adjacent the wordline trunk regions 44 and shorter in regions along the channel regions 40/42. Specifically, the illustrated wordline branch regions 46a/46b have first vertical dimensions 50 in regions along the wordline trunk regions 44, and second vertical dimensions 52 in regions extending to under the channel regions 40/42; with the second vertical dimensions 52 being less than the first vertical dimensions 50. In some embodiments the vertical dimensions 52 may be less than or equal to about 75% of the vertical dimensions 50, less than or equal to about 50% of the vertical dimensions 50, etc. Vertical dimensions 50 and 52 may have any suitable relationship, and in some embodiments may be about equal to one another. The vertical dimensions 50 of the wordline branch regions are about equal to vertical dimensions of the wordline trunk regions 44.

In the shown embodiment the wordline trunk regions 44 are over conductive lines 60 (FIG. 2), and spaced from the conductive lines 60 by the insulative material 48. The conductive lines 60 may comprise a same composition as the wordline trunk regions 44 in some embodiments, and may comprise different compositions than the wordline trunk regions 44 in other embodiments. For instance, in some embodiments the conductive lines 60 may consist of (or consist essentially of) conductively-doped semiconductor material, while the wordline trunk regions 44 comprise metal. This may simplify fabrication in that conductively-doped silicon lines 60 may be formed in desired locations, silicon dioxide may be grown from upper surfaces of such lines, and then the metal-containing wordline trunk regions 44 may be deposited over such silicon dioxide. In contrast, if the conductive lines 60 comprise metal it may be more difficult to form oxide (or other desired insulator) over upper surfaces of the conductive lines 60 prior to forming the wordline trunk regions 44. Also, it may be desired that the wordlines 44 comprise metal in order to have desired low resistance and rapid response speed; whereas conductive lines 60 may provide suitable operational performance even if the conductive lines 60 are formed of conductively-doped semiconductor rather than of metal.

In operation the conductive lines 60 may be utilized to reduce, or even prevent, undesired carrier migration along bottom regions of fins 14. The conductive lines 60 are optional, and may be omitted in some embodiments.

The embodiment of FIGS. 1-3 has wordline branch regions 46 gating channel regions 40/42 of the fins 14 from only one side of the fins 14. In other embodiments the wordline branch regions 46 may be provided in pairs on opposing sides of the fins 14 to gate channel regions 40/42 from both sides of the fins 14. An example of such embodiments is described with reference to a memory array 10a in FIGS. 4-6. Each of the fins 14 may be considered to comprise a first side 63, and a second side 65 in opposing relation to the first side 63 (the first and second sides 63/65 are shown in FIG. 6).

Figure 5:
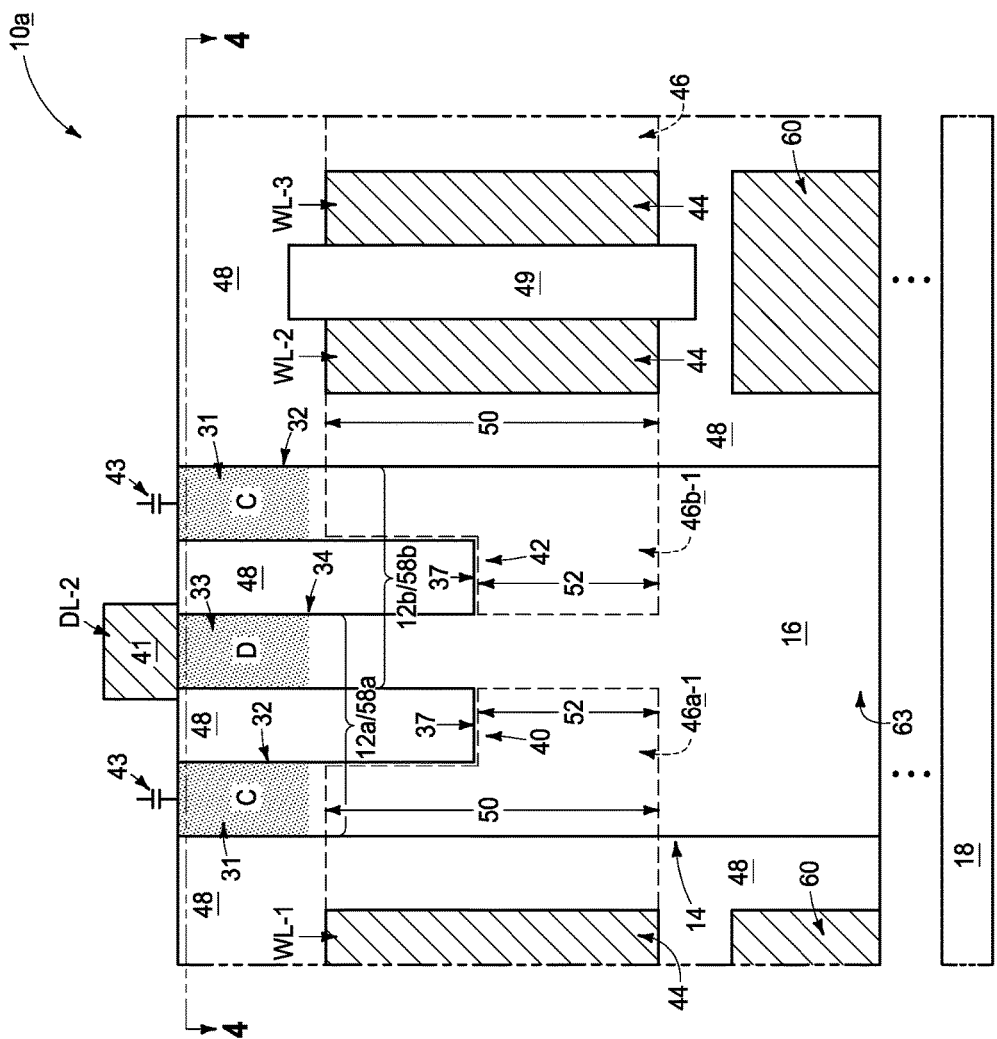
Figure 6:
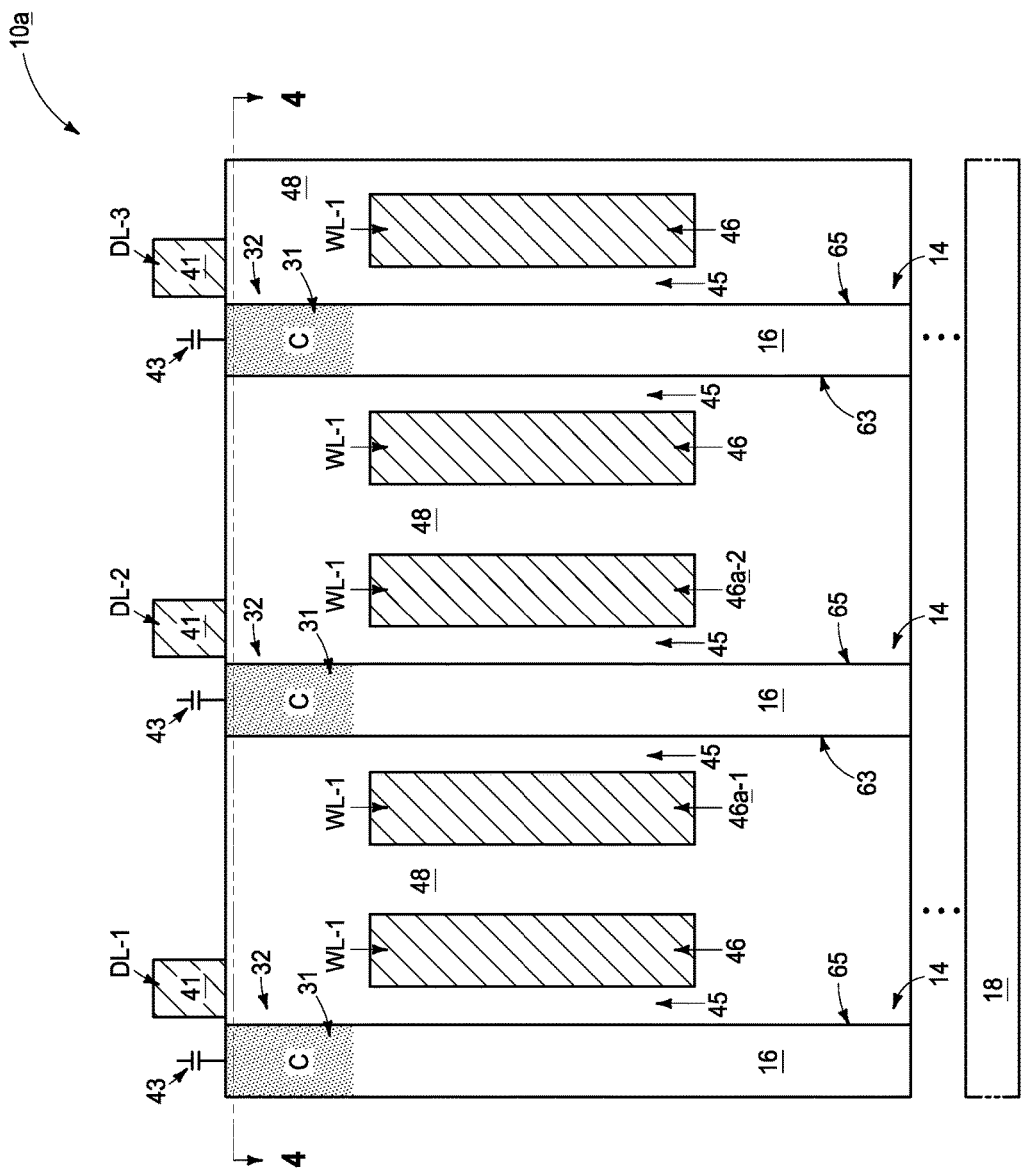

The first and second wordline branch regions 46a/46b are indicated to be associated with the fin 14 shown in the cross-section of FIG. 5; and accordingly to gate the channel regions 40/42 of such fin 14. The first and second wordline branch regions 46a/46b of FIG. 5 are along the first side 63 of the illustrated fin 14. Additional wordline branch regions are along the second side 65 of the same fin 14, as shown in the top-down view of FIG. 4. The wordline branch regions along the first side 63 are labeled as 46a-1 and 46b-1, and the wordline branch regions along the second side 65 are labeled as 46a-2 and 46b-2 so that the wordline branch regions on the second side 65 may be distinguished from the wordline branch regions on the first side 63.

The wordline branch regions 46a-1 and 46a-2 are both coupled with the same wordline (WL-1) and may be considered to be operationally paired with one another such that both of the wordline branch regions 46a-1 and 46a-2 are activated together to address the first channel region 40 of fin 14. Similarly, the wordline branch regions 46b-1 and 46b-2 are both coupled with the same wordline (WL-2) and may be considered to be operationally paired with one another.

The memory arrays of FIGS. 1-6 may be fabricated with any suitable processing. An example method of fabricating the memory array 10 of FIGS. 1-3 is described with reference to FIGS. 7-24. Similar processing may be utilized to fabricate the memory array 10a of FIGS. 4-6.

Figure 8:
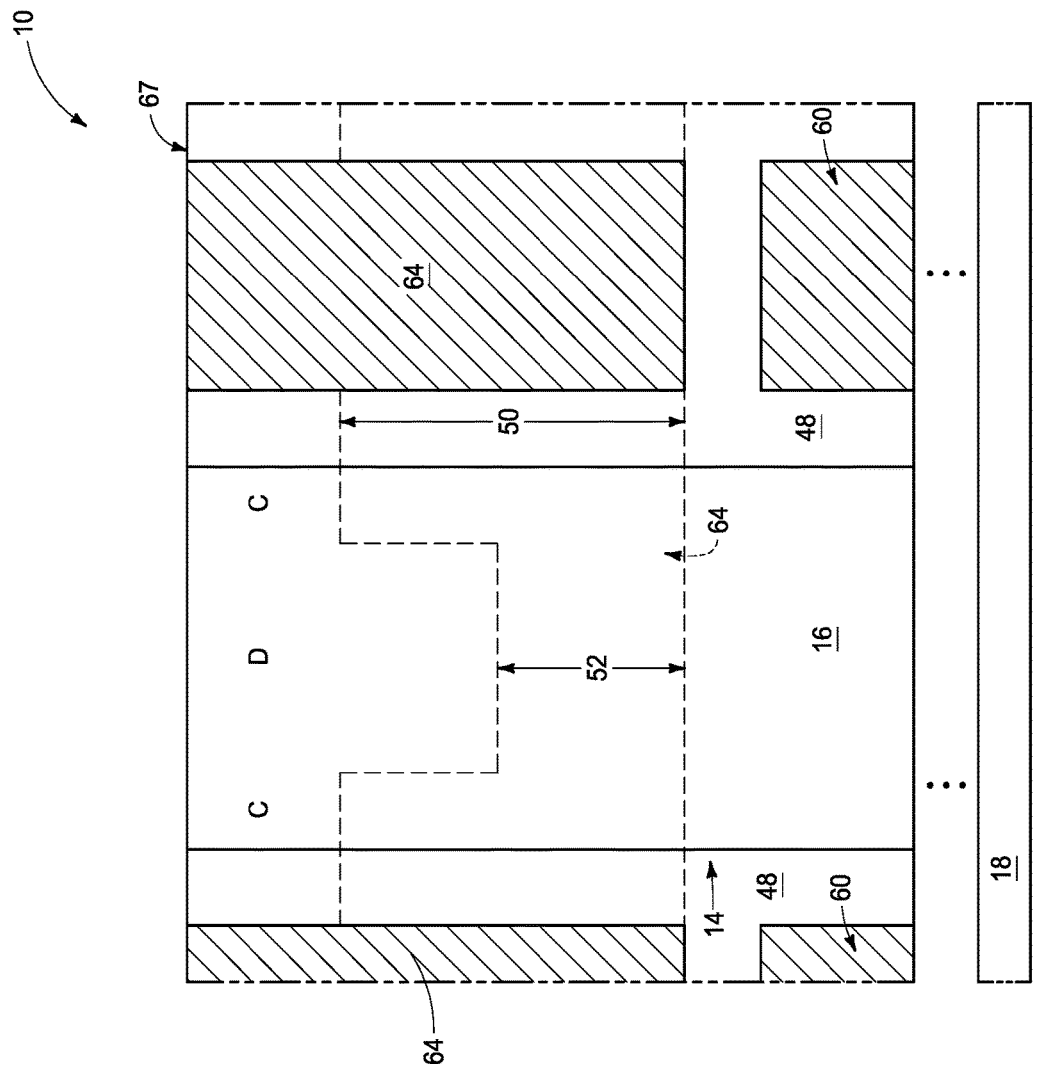

Referring to FIGS. 7 and 8, fins 14 are patterned from a semiconductor material 16, and insulative material 48 is provided adjacent the fins 14. The conductive lines 60 are formed within the insulative material 48 adjacent lower regions (i.e., bases) of fins 14, and the material 64 is provided over the conductive lines 60. The material 64 is spaced from the conductive lines 60 by regions of the insulative material 48. In some embodiments the material 64 may be wordline material, and may be ultimately incorporated into the wordline trunk regions 44 and branch regions 46 described above with reference to FIGS. 1-3. In other embodiments at least some of the material 64 may be placeholder material which ultimately is replaced with wordline material. The materials 60 and 64 may comprise any suitable materials. In some applications the materials 60/64 may comprise silicon, and in some embodiments may comprise conductively-doped silicon (the silicon may be in any suitable crystalline form; e.g., monocrystalline, polycrystalline, amorphous). The material 64 is shown comprising a general overall shape of the wordline trunk regions 44 and wordline branch regions 46 described above with reference to FIGS. 1-3. The material 64 is shown to be electrically conductive, but if the material 64 is placeholder material (i.e., sacrificial), the material 64 may or may not be electrically conductive.

The configuration of FIGS. 7 and 8 may be formed with any suitable processing. For instance, in some embodiments the conductive lines 60 may comprise conductively-doped silicon, and may be formed within trenches that extend into dielectric material 48. Upper surfaces of the conductive lines 60 may be oxidized to form the insulative material 48 across such upper surfaces. The material 64 may then be formed within the trenches and over the conductive lines 60. Additional processing may form trenches between fins 14 in regions 66 where the wordline branch regions 46 (FIG. 1) will be formed. The material 64 may be formed within such regions 66; either as the material 64 is formed over conductive lines 60 or in a separate processing stage from the formation of material 64 over the conductive lines 60. If it is desired to form material 64 in the pattern of FIG. 8 having tall regions 50 and short regions 52, any suitable patterning steps may be utilized to create such pattern.

Locations of the C and D regions within fins 16 are diagrammatically illustrated to assist the reader in understanding the relationship between the structures shown in FIGS. 7 and 8 and the structures of FIGS. 1-3, but the pedestals corresponding to such regions are not yet formed at the processing stage of FIGS. 7 and 8.

The construction 10 of FIGS. 7 and 8 has an upper surface 67.

Figure 10:
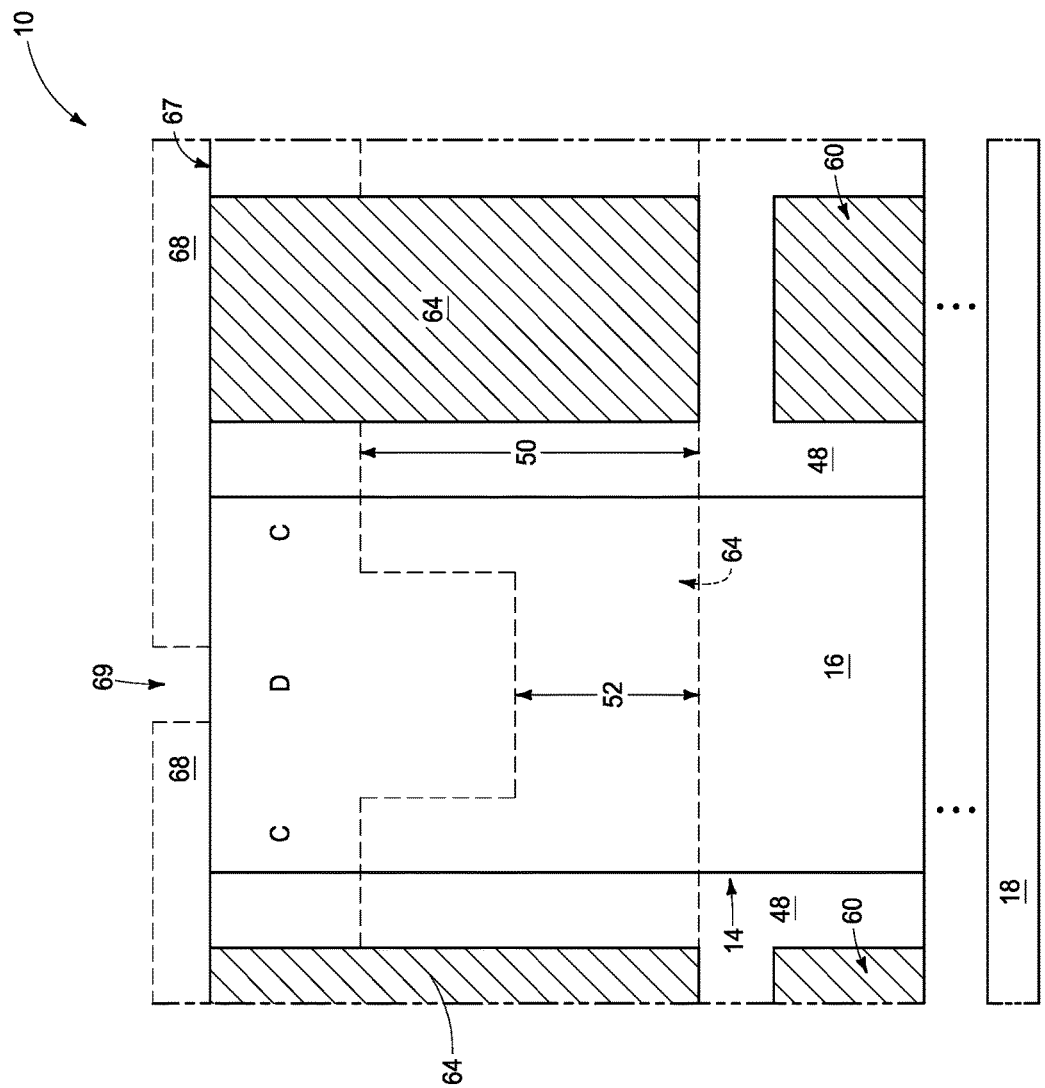

Referring to FIGS. 9 and 10, masking material 68 is formed across upper surface 67, and patterned to have openings 69 extending therethrough. The region of material 68 shown in the cross-section of FIG. 10 is a region in front of the plane of the rest of the cross-section (and thus material 68 is shown in dashed-line view in FIG. 10) so that the opening 69 may be seen in such cross-section. A region of material 64 in front of fin 14 is also shown in dashed-line view in FIG. 10 as such region is in front of the plane of the cross-section, and the opening 69 is vertically aligned with the region of material 64 that is in front of the fin 14.

Figure 11:
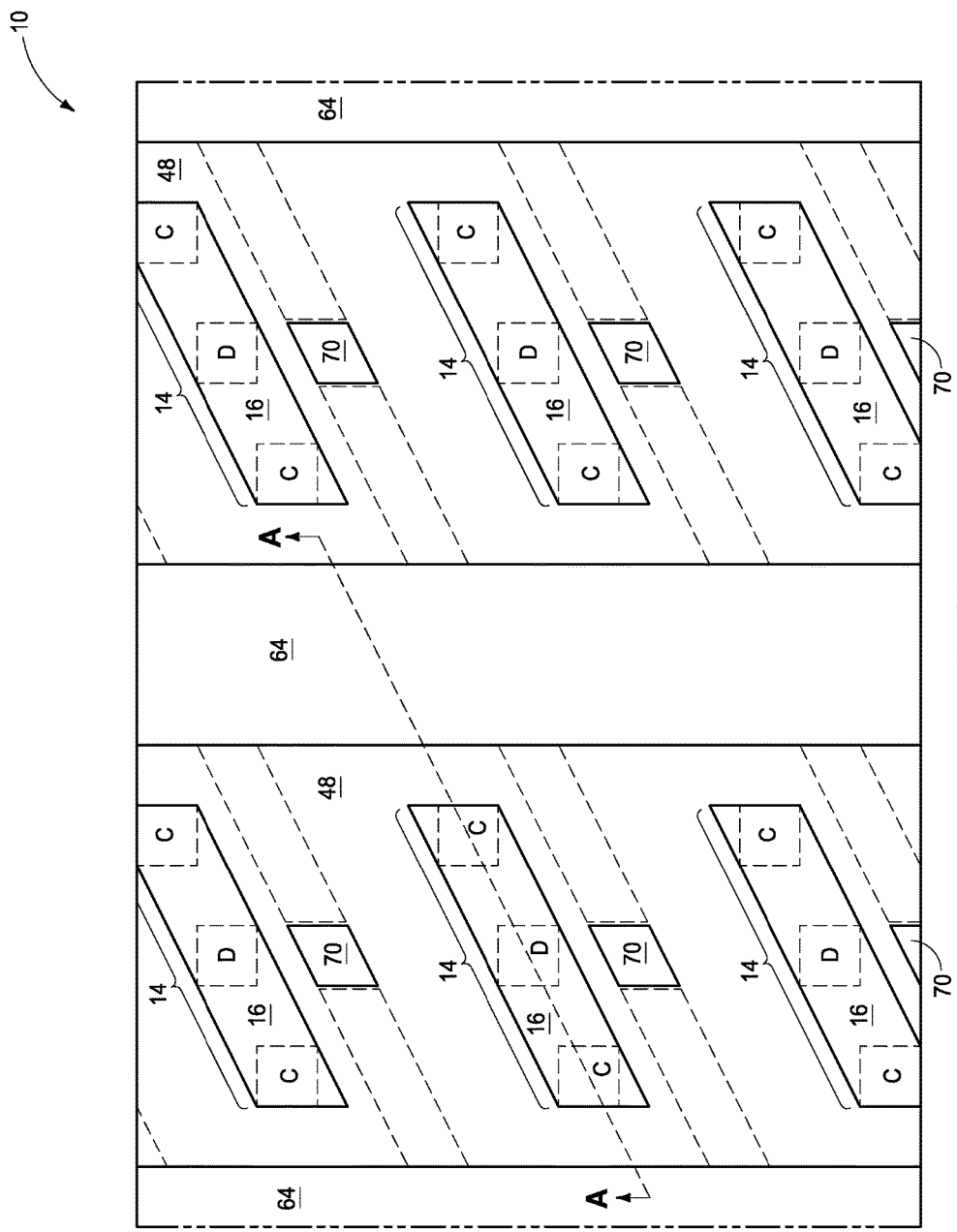
Figure 12:
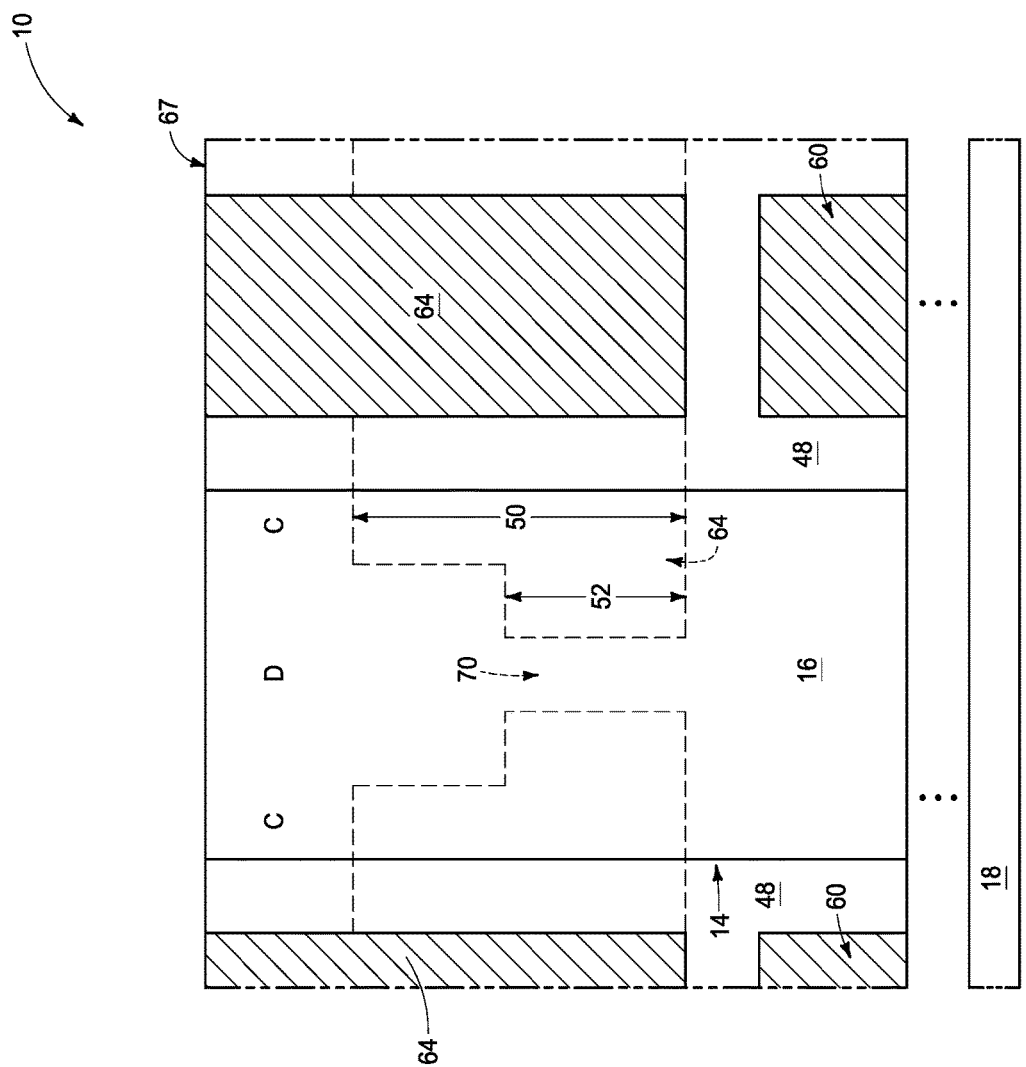

Referring to FIGS. 11 and 12, the openings 69 (FIGS. 9 and 10) are extended through material 64 and filled with insulative material 70, and masking material 68 (FIGS. 9 and 10) is removed from over upper surface 67. The insulative material 70 may ultimately correspond to an insulative structure provided along the second pedestals 34 (FIG. 2) and utilized to separate wordline branch regions 46a and 46b (FIG. 2) from one another. The insulative material 70 is not shown in the cross-sectional view of FIG. 12 in that it is out of the plane of the cross-section (specifically, in front of such plane), but a dashed arrow is provided to show an approximate location of material 70. The region of wordline material 64 in front of fin 14 (such region of the wordline material 64 is illustrated in dashed line view in FIG. 12) is shown to be broken due to an opening 69 (FIG. 10) having been extended through such region of the wordline material 64, and the material 70 is within such break in the wordline material 64.

Figure 14:
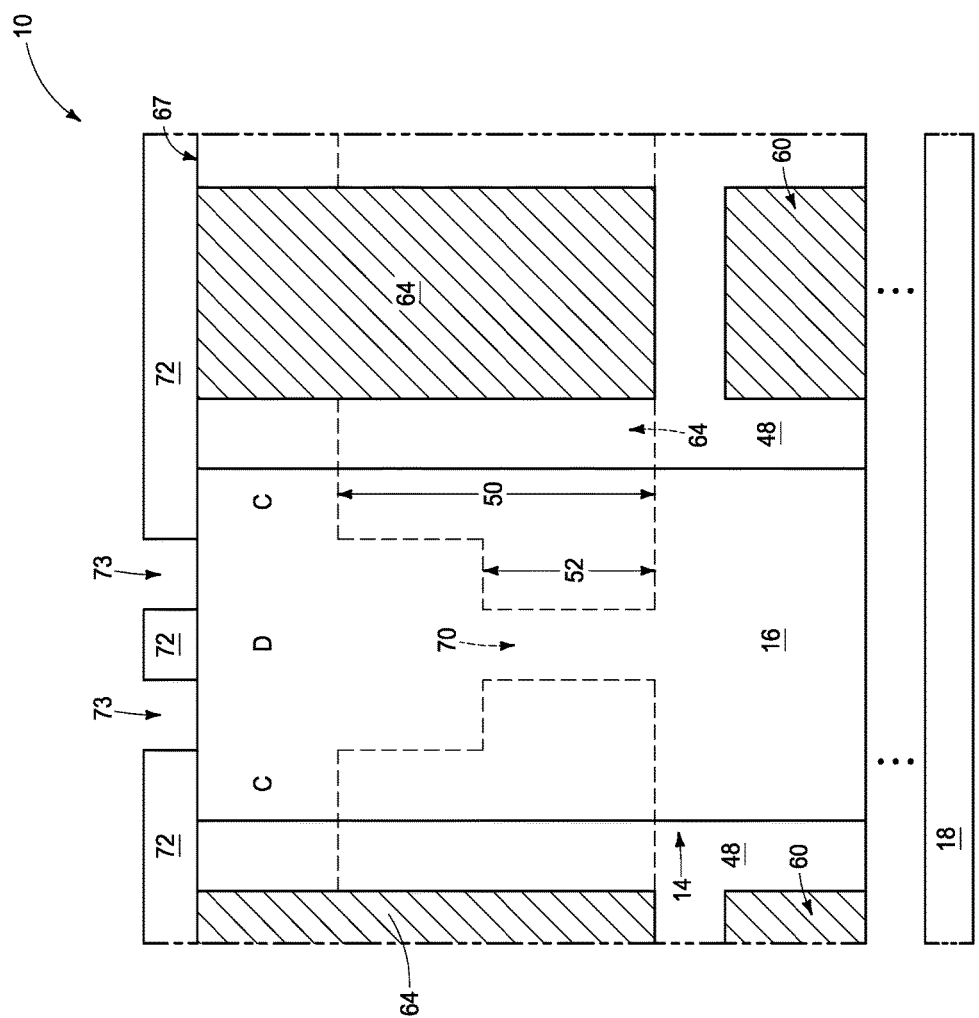

Referring to FIGS. 13 and 14, masking material 72 is formed across upper surface 67, and is patterned to have openings 73 extending therethrough.

Figure 16:
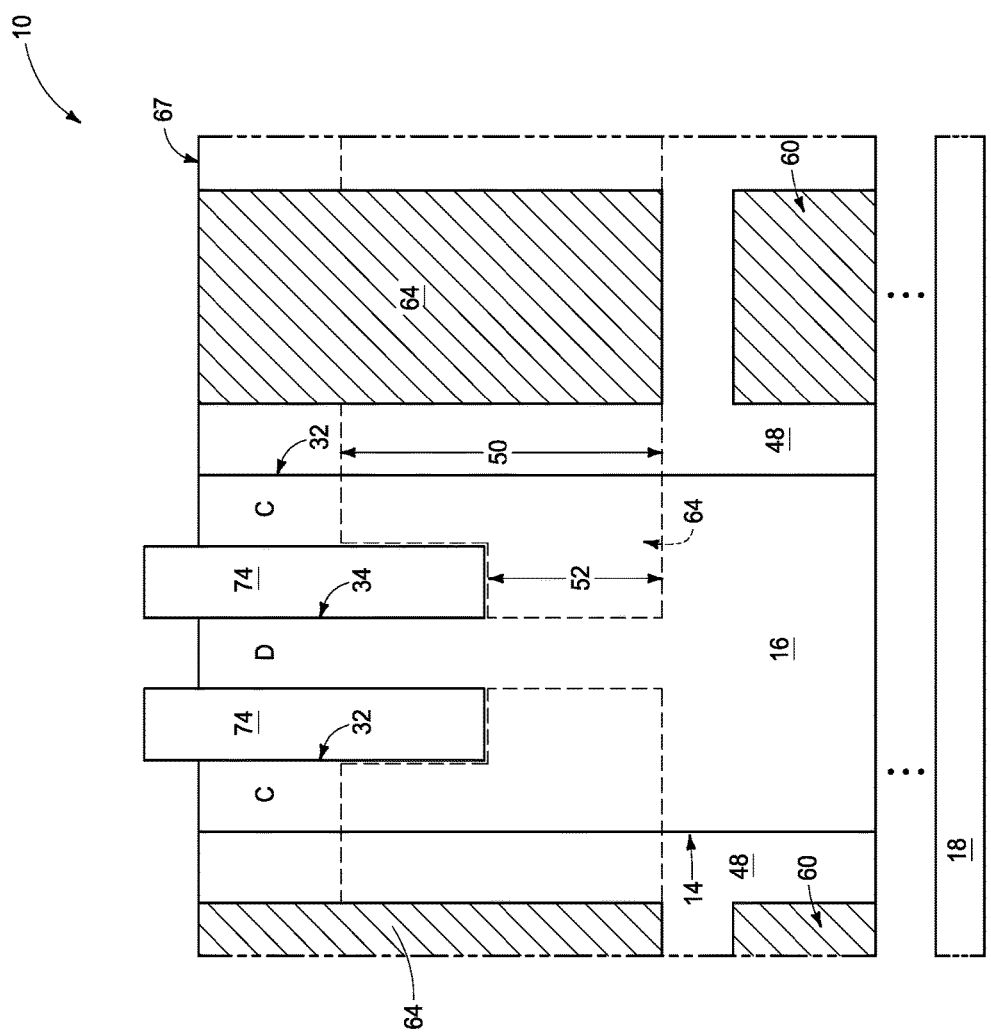

Referring to FIGS. 15 and 16, the openings 73 (FIGS. 13 and 14) are extended into semiconductor 16 of fin 14 and filled with insulative material 74; and masking material 72 (FIGS. 13 and 14) is removed from over upper surface 67. The first and second pedestals 32/34 are thus formed within fin 14.

Figure 17:
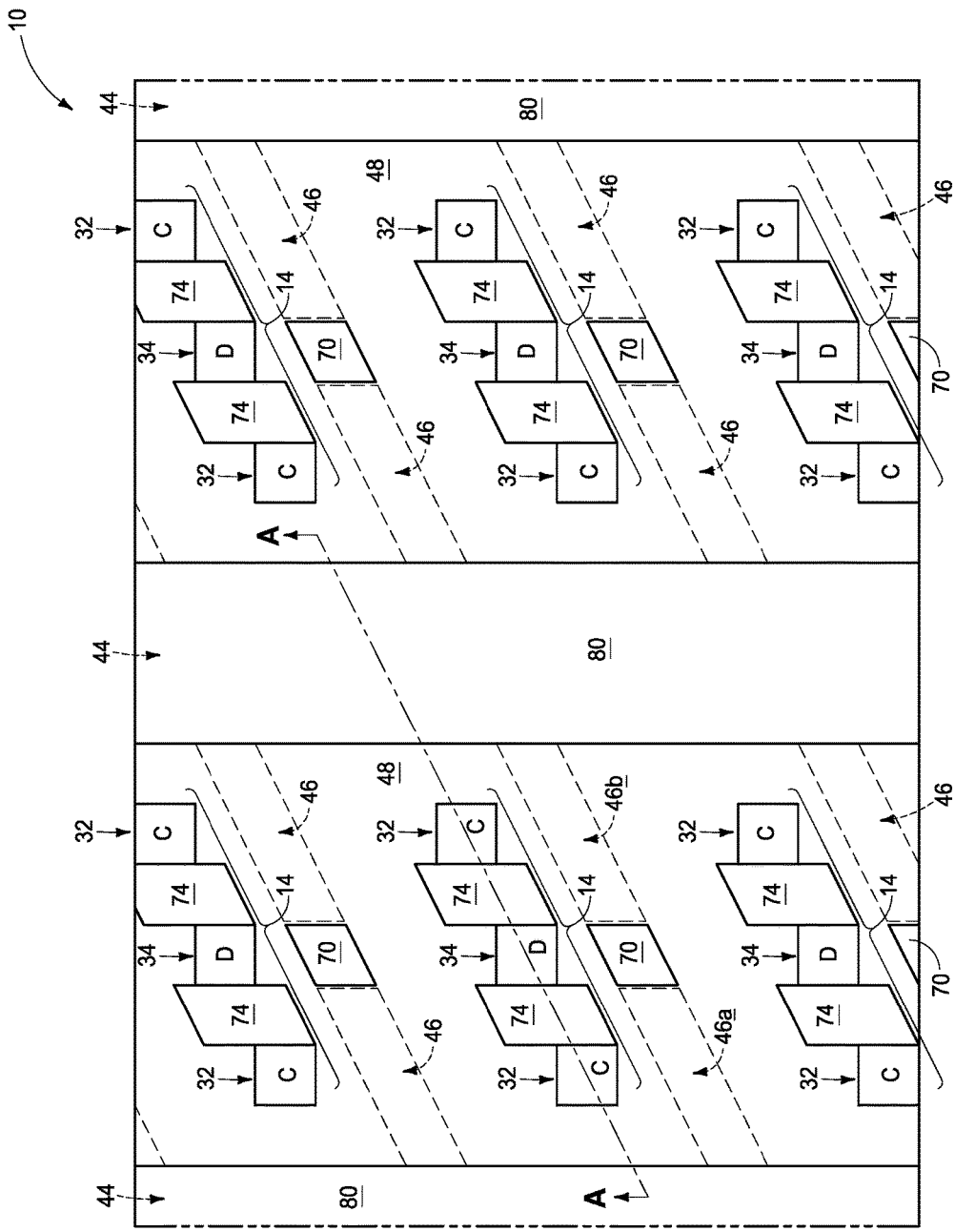
Figure 18:
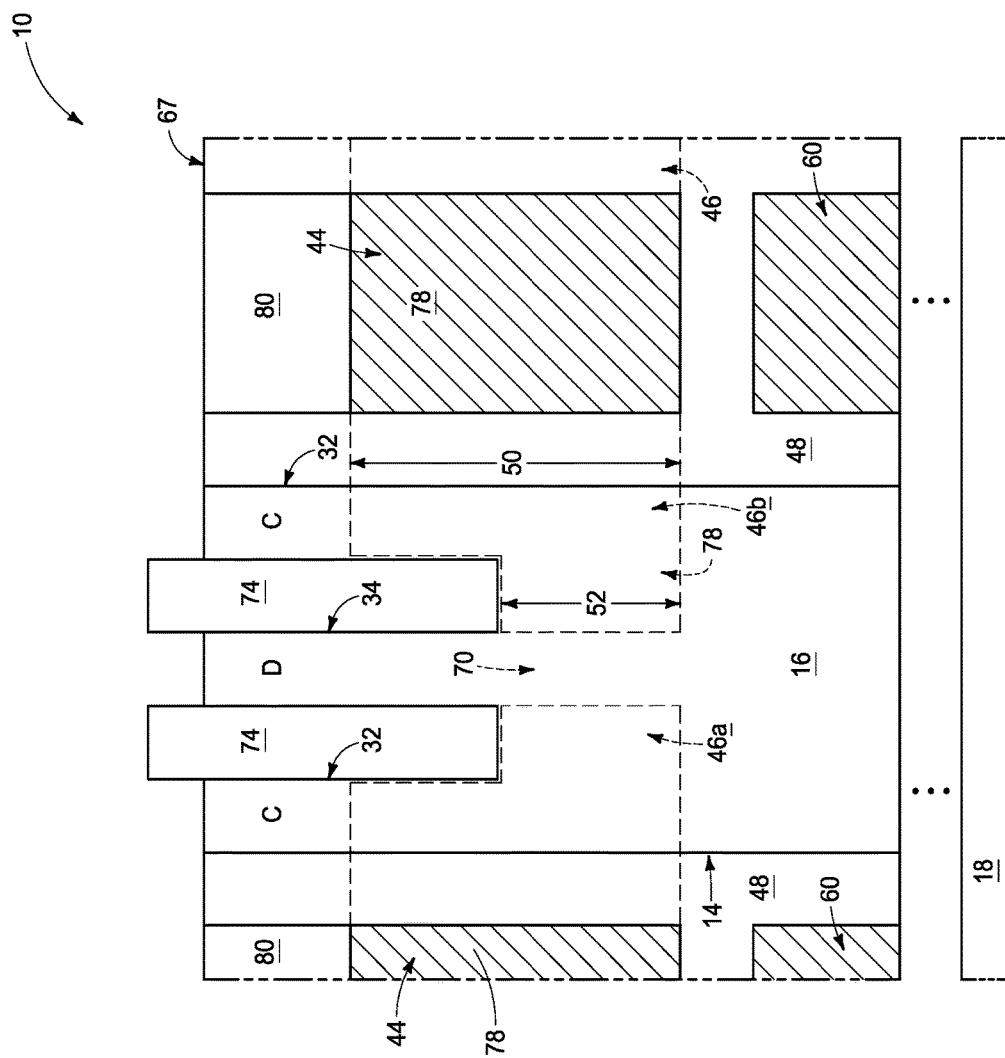

Referring to FIGS. 17 and 18, material 64 (FIGS. 15 and 16) is replaced with metal-containing material 78, which is reduced in height relative to the placeholder material 64. Specifically, the metal-containing material 78 has the height 50 across the wordline trunk regions 44, and has the heights 50 and 52 across the wordline branch regions 46. In some embodiments, material 64 may be utilized for the wordline trunk regions 44 and wordline branch regions 46, and accordingly the replacement of material 64 with material 78 may be optional.

Insulative material 80 is provided over metal-containing material 78. The material 80 may comprise any suitable composition or combination of compositions; and may, for example, comprise silicon nitride, silicon dioxide, etc.

Figure 20:
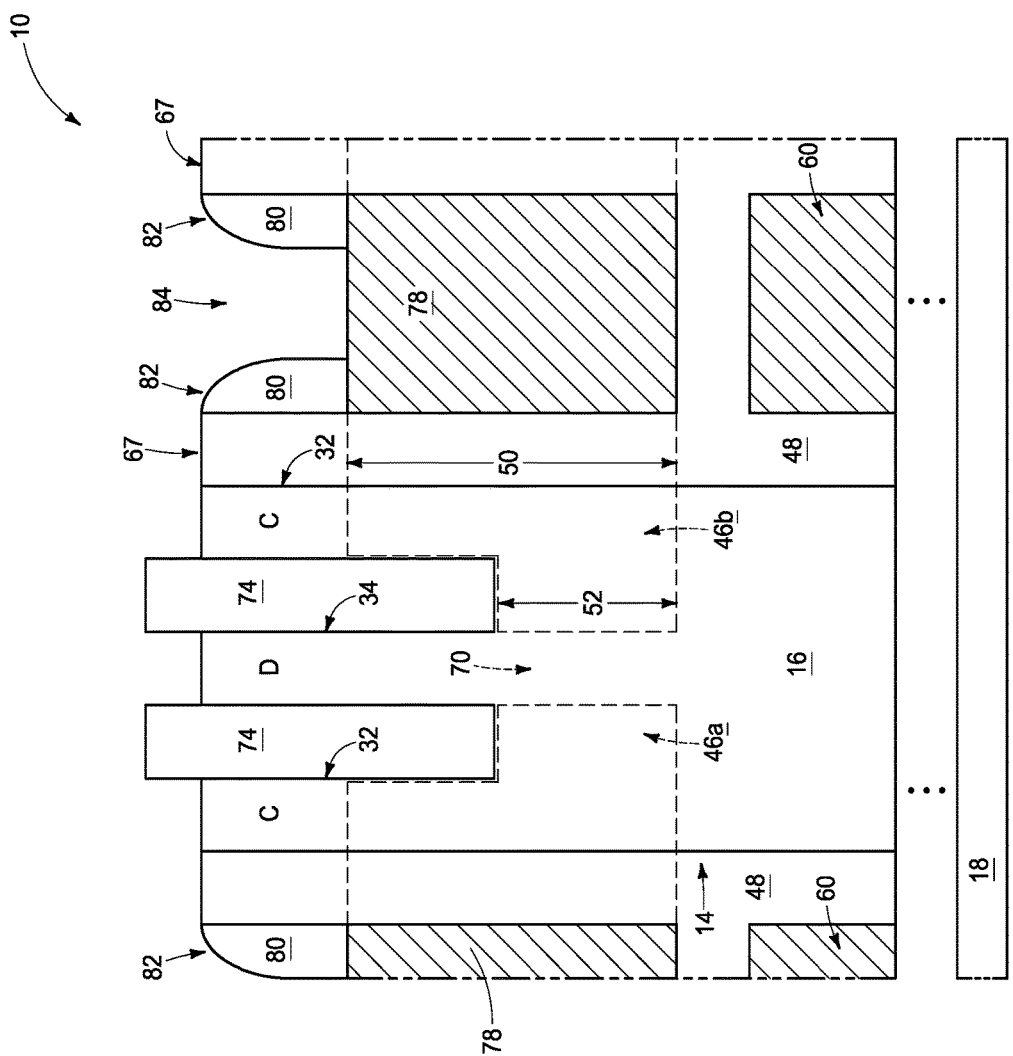

Referring to FIGS. 19 and 20, insulative material 80 is patterned into spacers 82. Alternatively, the material 80 may be removed and replaced with another material which is patterned into the spacers 82.

A protective material (not shown) may extend across the upper surface 67 of construction 10 between the spacers 82 to protect such surface during a subsequent etch into material 78 (described below with reference to FIGS. 21 and 22). In some embodiments such protective material may be a same material as is utilized in spacers 82, and in other embodiments the protective material may be a different material than that utilized in spacers 82.

Openings 84 are defined between the spacers 82; or in other words are patterned by the spacers 82.

Figure 22:
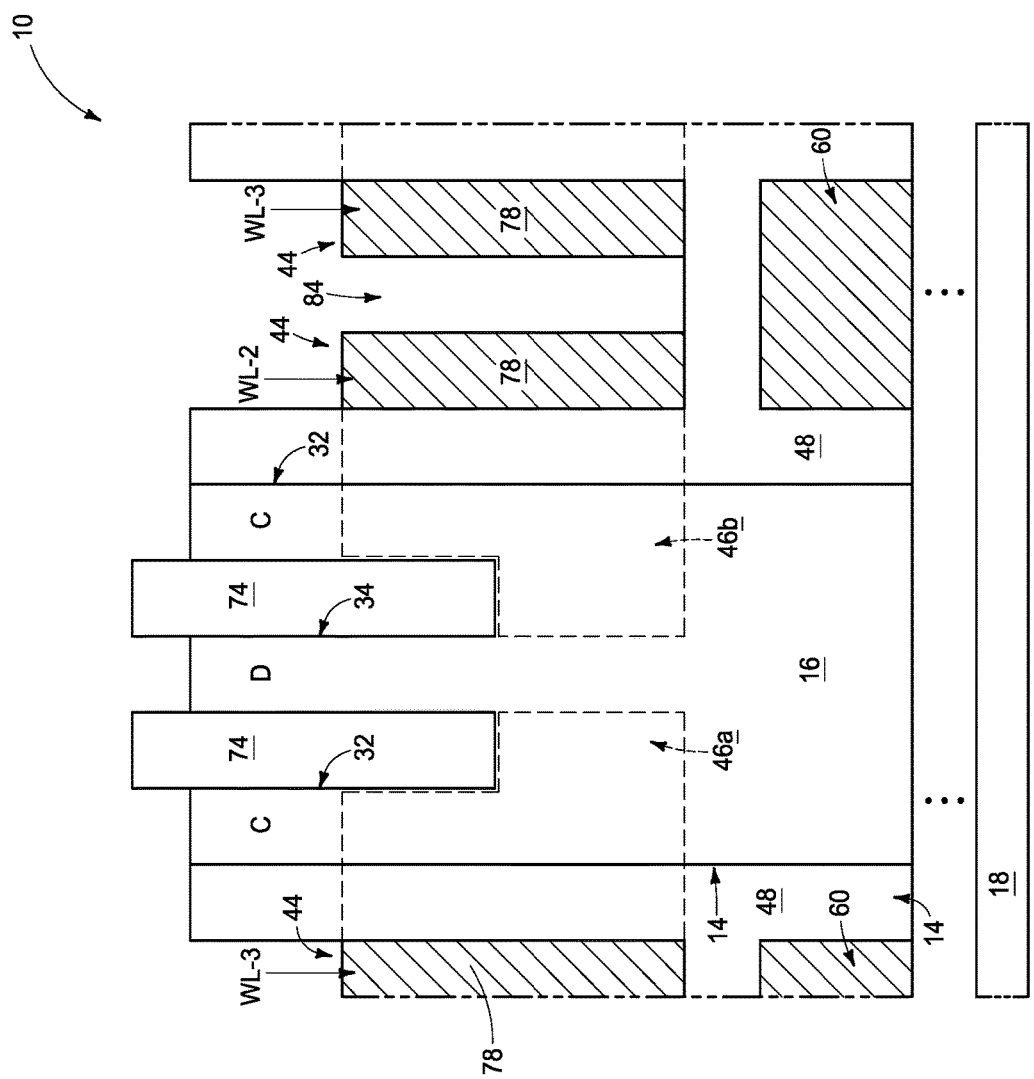

Referring to FIGS. 21 and 22, the openings 84 are extended through material 78 to divide the material into wordlines WL-1, WL-2, WL-3 and WL-4, and then the spacers 82 (FIGS. 19 and 20) are removed. The wordlines WL-1, WL-2, WL-3 and WL-4 comprise the trunk regions 44 and branch regions 46.

Figure 23:
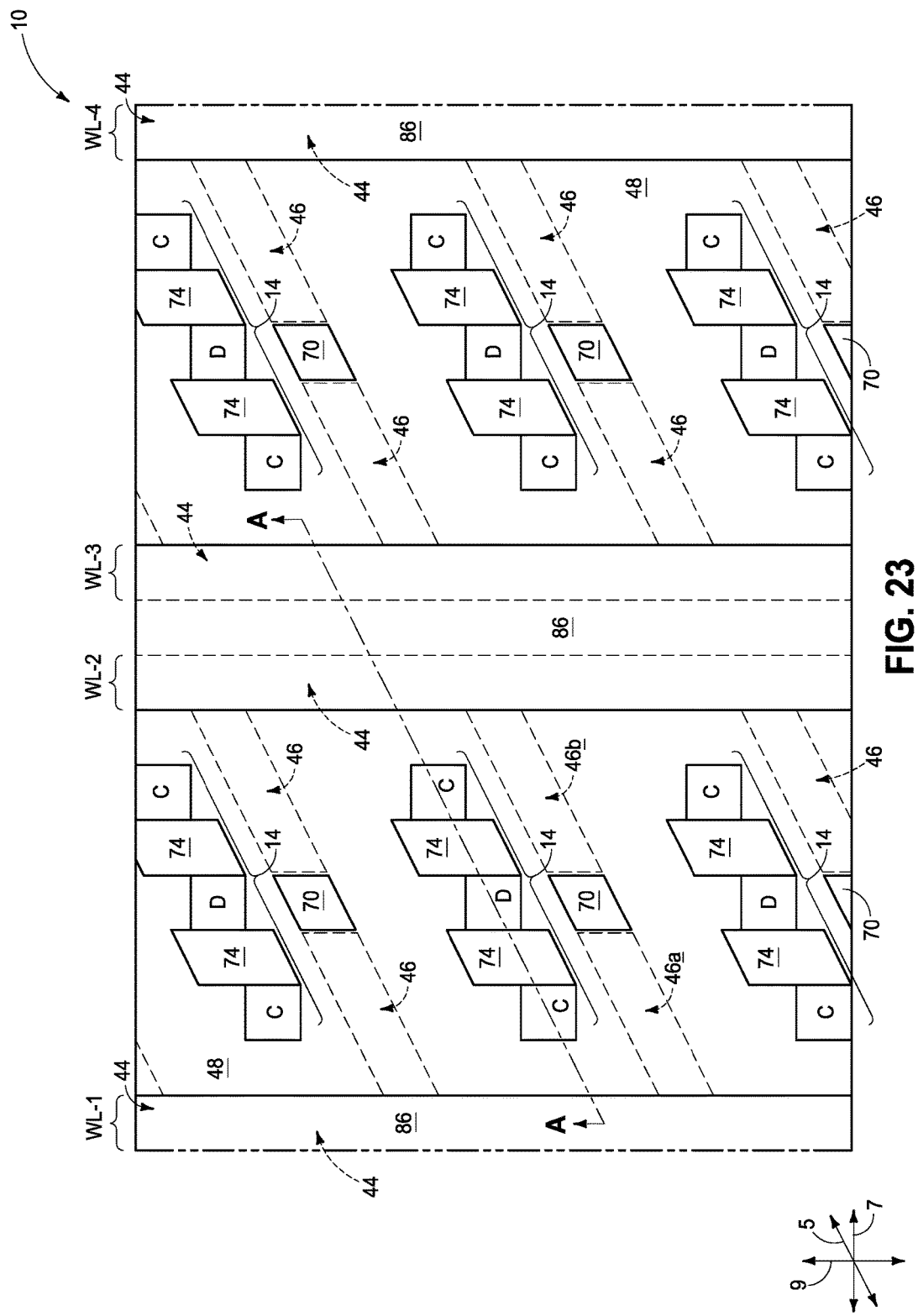
Figure 24:
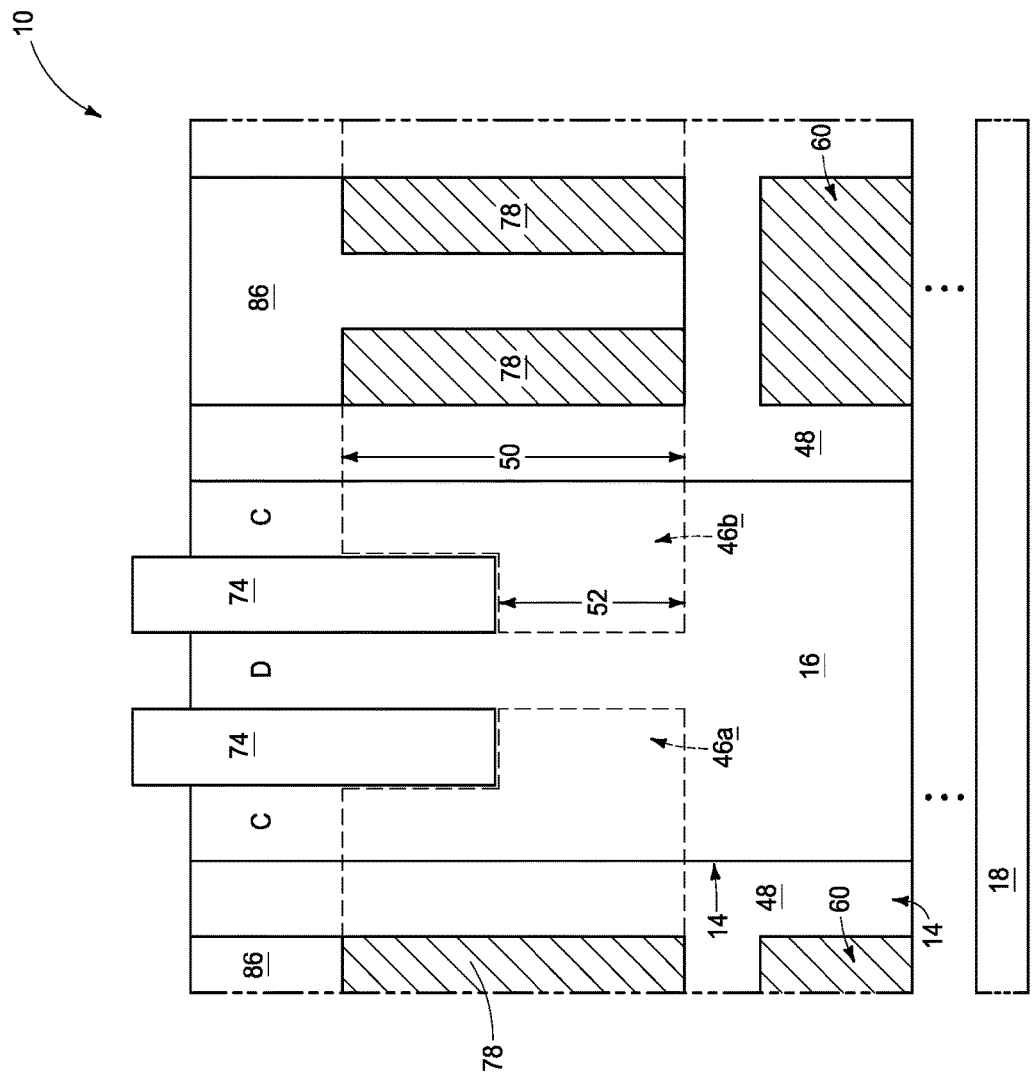

Referring to FIGS. 23 and 24, insulative material 86 is formed over conductive material 78 to complete a construction of the type described above with reference to FIGS. 1-3. The doped regions 31 and 33 of FIGS. 1-3 are not shown in the completed construction of FIGS. 23 and 24; but it is to be understood that such doped regions could be formed at any suitable processing stage. For instance, the fins 14 may comprise appropriate dopant at the appropriate depth for fabrication of the doped regions at the processing stage of FIGS. 7 and 8. Alternatively, at least some of such dopant may be implanted at a processing stage subsequent to that of FIGS. 7 and 8.

A difference between the construction of FIGS. 23 and 24 and that of FIGS. 1-3 is that insulative materials 70 and 74 are present in FIGS. 23 and 24 and absent from FIGS. 1-3. However, it is to be understood that the materials 70 and 74 may comprise a same composition as material 48, and accordingly may merge into a single material 48 of the type described above with reference to FIGS. 1-3. It is also to be understood that the material 48 of FIGS. 1-3 may comprise multiple different compositions, and accordingly could be representative of a heterogeneous insulative material of the type shown in FIGS. 23 and 24; which comprises the insulative structures containing insulative material 70, and comprises the insulative structures containing insulative material 74.

The various structures and architectures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, unless specifically stated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory array having memory cells arranged in rows and columns. The rows extend along a first direction and the columns extend along a second direction, with an angle between the first and second directions being less than 90°. Wordline trunk regions extend across the array and along a third direction substantially orthogonal to the second direction of the columns. Wordline branch regions extend from the wordline trunk regions and along the first direction. Semiconductor-material fins are along the rows. Each semiconductor-material fin has a first source/drain region, a second source/drain region, and a channel region between the first and second source/drain regions. Each channel region is overlapped by a wordline branch region associated with the fin comprising the channel region. Digit lines extend along the columns and are electrically coupled with the second source/drain regions.

Some embodiments include a memory array having memory cells arranged in rows and columns. The rows extend along a first direction and the columns extend along a second direction, with an angle between the first and second directions being less than 90°. Semiconductor-material fins are along the rows. Each semiconductor-material fin has two first pedestals and a single second pedestal between the first pedestals. First source/drain regions are within the first pedestals, and a second source/drain region is within the second pedestal. A first channel region is between one of the first pedestals and the second pedestal, and a second channel region is between the other of the first pedestals and the second pedestal. Digit lines extend along the columns and are electrically coupled with the second source/drain regions. Wordline branch regions extend along the first direction. The wordline branch regions extend along the semiconductor-material fins, and join with wordline trunk regions that extend along a direction other than the first direction. Each semiconductor-material fin has the first channel region overlapped by a first wordline branch region associated with the fin, and has the second channel region overlapped by a second wordline branch region associated with the fin. The first and second wordline branch regions along each semiconductor-material fin are spaced from one another by insulative structures that extend along the second pedestals of the semiconductor-material fins.

Some embodiments include a memory array having memory cells arranged in rows and columns. The rows extend along a first direction and the columns extend along a second direction, with an angle between the first and second directions being less than 90°. Semiconductor-material fins are along the rows. Each semiconductor-material fin has two first pedestals and a single second pedestal between the first pedestals. First source/drain regions are within the first pedestals, and a second source/drain region is within the second pedestal. A first channel region is between one of the first pedestals and the second pedestal, and a second channel region is between the other of the first pedestals and the second pedestal. The first source/drain region is beneath a first trough which is between said one of the first pedestals and the second pedestal, and the second source/drain region is beneath a second trough which is between said other of the first pedestals and the second pedestal. Digit lines extend along the columns and are electrically coupled with the second source/drain regions. Wordline trunk regions extend across the array and along a third direction substantially orthogonal to the second direction of the columns. Wordline branch regions extend from the wordline trunk regions and along the first direction. The wordline branch regions extend along the semiconductor-material fins. Each semiconductor-material fin has the first channel region overlapped by a first wordline branch region associated with the fin, and has the second channel region overlapped by a second wordline branch region associated with the fin and coupled with a different wordline trunk region than the first wordline branch region. The first wordline branch regions have tall regions along the wordline trunk regions and short regions extending under the first troughs, and the second wordline branch regions have tall regions along the wordline trunk regions and short regions extending under the second troughs.

Some embodiments include an apparatus comprising a semiconductor-material fin, a first conductive trunk line and a first conductive branch line. The semiconductor-material fin comprises a first pedestal serving as a first source/drain region, a second pedestal serving as a second source/drain region, and a first trough defining a first channel region between the first and second source/drain regions. The first and second source/drain regions and the channel region are arranged in line in a first direction. The first conductive trunk line extends in a second direction crossing the first direction. The first conductive branch line branches from the first conductive trunk line and extends in the first direction such that a portion of the first conductive branch line overlaps the first channel region with an intervention of first gate dielectric material to serve as a first gate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory array, comprising:
   memory cells arranged in rows and columns; the rows extending along a first direction and the columns extending along a second direction, with an angle between the first and second directions being less than 90°;
   wordline trunk regions extending across the array and along a third direction substantially orthogonal to the second direction of the columns;
   wordline branch regions extending from the wordline trunk regions and along the first direction;
   semiconductor-material fins along the rows, each semiconductor-material fin having a first source/drain region, a second source/drain region, and a channel region between the first and second source/drain regions; each channel region being overlapped by a wordline branch region associated with the fin comprising the channel region; and
   digit lines extending along the columns and being electrically coupled with the second source/drain regions.

2. The memory array of claim 1 wherein each semiconductor-material fin has first and second sides in opposing relation to one another; wherein the wordline branch region associated with each fin is on the first side of the fin and is operationally paired with another wordline branch region on the second side of the fin.

3. The memory array of claim 1 wherein the wordline trunk regions are over conductive lines and are spaced from the conductive lines by dielectric material.

4. The memory array of claim 3 wherein the wordline trunk regions comprise a same composition as the conductive lines.

5. The memory array of claim 3 wherein the wordline trunk regions comprise a different composition than the conductive lines.

6. The memory array of claim 5 wherein the wordline trunk regions comprise metal, and wherein the conductive lines consist of conductively-doped semiconductor material.

7. The memory array of claim 1 further comprising charge-storage devices electrically coupled with the first source/drain regions.

8. A memory array, comprising:
   memory cells arranged in rows and columns; the rows extending along a first direction and the columns extending along a second direction, with an angle between the first and second directions being less than 90°;
   semiconductor-material fins along the rows; each semiconductor-material fin having two first pedestals and a single second pedestal between the first pedestals; first source/drain regions being within the first pedestals, and a second source/drain region being within the second pedestal; a first channel region being between one of the first pedestals and the second pedestal, and a second channel region being between the other of the first pedestals and the second pedestal;
   digit lines extending along the columns and being electrically coupled with the second source/drain regions; and
   wordline branch regions extending along the first direction, and joining with wordline trunk regions that extend along a direction other than the first direction; the wordline branch regions extending along the semiconductor-material fins, each semiconductor-material fin having the first channel region overlapped by a first wordline branch region associated with the fin, and having the second channel region overlapped by a second wordline branch region associated with the fin; the first and second wordline branch regions along each semiconductor-material fin being spaced from one another by insulative structures that extend along the second pedestals of the semiconductor-material fins.

9. The memory array of claim 8 wherein the wordline branch regions are taller in regions adjacent the wordline trunk regions and shorter in regions along the channel regions.

10. The memory array of claim 8 wherein the wordline branch regions comprise a same composition as the wordline trunk regions.

11. The memory array of claim 8 wherein the wordline trunk regions are over conductive lines.

12. The memory array of claim 11 wherein the wordline branch regions are not over said conductive lines.

13. The memory array of claim 8 further comprising charge-storage devices electrically coupled with the first source/drain regions.

14. The memory array of claim 13 wherein the charge-storage devices are capacitors.

15. The memory array of claim 13 wherein the charge-storage devices are ferroelectric capacitors.

16. The memory array of claim 8 wherein each semiconductor-material fin has first and second sides in opposing relation to one another; wherein the first wordline branch region associated with each fin is on the first side of the fin and is operationally paired with another first wordline branch region on the second side of the fin; and wherein the second wordline branch region associated with each fin is on the first side of the fin and is operationally paired with another second wordline branch region on the second side of the fin.

17. A memory array, comprising:
   memory cells arranged in rows and columns; the rows extending along a first direction and the columns extending along a second direction, with an angle between the first and second directions being less than 90°;
   semiconductor-material fins along the rows; each semiconductor-material fin having two first pedestals and a single second pedestal between the first pedestals; first source/drain regions being within the first pedestals, and a second source/drain region being within the second pedestal; a first channel region being between one of the first pedestals and the second pedestal, and a second channel region being between the other of the first pedestals and the second pedestal; the first source/drain region being beneath a first trough which is between said one of the first pedestals and the second pedestal, and the second source/drain region being beneath a second trough which is between said other of the first pedestals and the second pedestal;
   digit lines extending along the columns and being electrically coupled with the second source/drain regions;
   wordline trunk regions extending across the array and along a third direction substantially orthogonal to the second direction of the columns; and
   wordline branch regions extending from the wordline trunk regions and along the first direction; the wordline branch regions extending along the semiconductor-material fins, each semiconductor-material fin having the first channel region overlapped by a first wordline branch region associated with the fin, and having the second channel region overlapped by a second wordline branch region associated with the fin and coupled with a different wordline trunk region than the first wordline branch region; the first wordline branch regions having tall regions along the wordline trunk regions and short regions extending under the first troughs, and the second wordline branch regions having tall regions along the wordline trunk regions and short regions extending under the second troughs.

18. The memory array of claim 17 wherein each semiconductor-material fin has first and second sides in opposing relation to one another; wherein the first wordline branch region associated with each fin is on the first side of the fin and is operationally paired with another first wordline branch region on the second side of the fin; and wherein the second wordline branch region associated with each fin is on the first side of the fin and is operationally paired with another second wordline branch region on the second side of the fin.

19. The memory array of claim 17 wherein the wordline trunk regions are over conductive lines and are spaced from the conductive lines by dielectric material.

20. The memory array of claim 19 wherein the wordline trunk regions comprise a same composition as the conductive lines.

21. The memory array of claim 19 wherein the wordline trunk regions comprise a different composition than the conductive lines.

22. The memory array of claim 21 wherein the wordline trunk regions comprise metal and the conductive lines consist of conductively-doped semiconductor material.

23. The memory array of claim 19 wherein the wordline branch regions are not over the conductive lines.

24. The memory array of claim 17 further comprising charge-storage devices electrically coupled with the first source/drain regions.

* * * * *